(12) United States Patent
Shirakawa

(10) Patent No.: US 9,437,301 B2
(45) Date of Patent: Sep. 6, 2016

(54) NON-VOLATILE SEMICONDUCTOR MEMORY DEVICE

(71) Applicant: Kabushiki Kaisha Toshiba, Minato-ku (JP)

(72) Inventor: Masanobu Shirakawa, Chigasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/669,407

(22) Filed: Mar. 26, 2015

(65) Prior Publication Data
US 2015/0200012 A1 Jul. 16, 2015

Related U.S. Application Data

(63) Continuation of application No. 13/931,305, filed on Jun. 28, 2013, now Pat. No. 9,007,836, which is a continuation-in-part of application No. 13/242,902, filed on Sep. 23, 2011, now Pat. No. 8,526,241.

(30) Foreign Application Priority Data

Jan. 13, 2011 (JP) .................................. 2011-004953

(51) Int. Cl.
*G11C 16/26* (2006.01)
*G11C 16/04* (2006.01)
(Continued)

(52) U.S. Cl.
CPC ....... *G11C 16/0483* (2013.01); *G11C 16/0408* (2013.01); *G11C 16/08* (2013.01); *G11C 29/025* (2013.01); *G11C 29/789* (2013.01);
(Continued)

(58) Field of Classification Search
CPC ... G11C 16/0483; G11C 16/26; G11C 16/08; G11C 16/16
USPC ................. 365/185.17, 189.05, 185.23, 200, 365/230.06, 185.12
See application file for complete search history.

(56) References Cited

U.S. PATENT DOCUMENTS 5,787,445 A * 7/1998 Daberko ............... G06F 3/0626
5,822,256 A 10/1998 Bauer et al.
(Continued)

FOREIGN PATENT DOCUMENTS

JP 4-205798 7/1992
JP 6-119795 4/1994
(Continued)

OTHER PUBLICATIONS

Office Action mailed Jun. 11, 2013 in Japanese Patent Application No. 2011-004953, filed Jan. 13, 2011 (w/English-language Translation), 4 pages.

*Primary Examiner* — Ly D Pham
(74) *Attorney, Agent, or Firm* — Oblon, McClelland, Maier & Neustadt, L.L.P

(57) ABSTRACT

According to one embodiment, a non-volatile semiconductor memory device comprises a memory cell array and a memory region. The memory cell array has a plurality of physical blocks. Each of the plurality of physical blocks includes a plurality of string units. Each string unit has a plurality of NAND strings that shares a plurality of word lines connected to a plurality of memory cells, respectively. The memory region is disposed to one of the plurality of physical blocks. Each of the plurality of string units configures a first logical block, and when the first logical block is failed, information of the first failed logical block is stored in a first region of the memory region.

10 Claims, 28 Drawing Sheets

(51) Int. Cl.
*G11C 16/08* (2006.01)
*G11C 16/16* (2006.01)
*G11C 5/06* (2006.01)
*G11C 29/02* (2006.01)
*G11C 29/00* (2006.01)
*G11C 16/02* (2006.01)
*G11C 29/04* (2006.01)
*G11C 5/02* (2006.01)
*G11C 16/10* (2006.01)
*G11C 16/00* (2006.01)
*G11C 29/12* (2006.01)
*G11C 29/44* (2006.01)

(52) U.S. Cl.
CPC .......... *G11C 5/02* (2013.01); *G11C 5/06* (2013.01); *G11C 16/00* (2013.01); *G11C 16/02* (2013.01); *G11C 16/10* (2013.01); *G11C 16/16* (2013.01); *G11C 16/26* (2013.01); *G11C 29/04* (2013.01); *G11C 2029/1202* (2013.01); *G11C 2029/4402* (2013.01); *G11C 2213/75* (2013.01)

(56) References Cited

U.S. PATENT DOCUMENTS

| | | | |
|---|---|---|---|
| 6,462,985 B2 | 10/2002 | Hosono et al. | |
| 6,581,132 B1* | 6/2003 | Kakinuma | G11C 29/765 711/103 |
| 6,646,930 B2 | 11/2003 | Takeuchi et al. | |
| 7,369,454 B2 | 5/2008 | Shiga | |
| 7,849,357 B2 | 12/2010 | Nakano | |
| 8,120,961 B2 | 2/2012 | Katsumata et al. | |
| 8,189,371 B2 | 5/2012 | Katsumata et al. | |
| 8,194,453 B2 | 6/2012 | Maejima | |
| 8,938,586 B2* | 1/2015 | Yano | G06F 12/0246 711/103 |
| 9,007,836 B2* | 4/2015 | Shirakawa | G11C 16/0483 365/185.02 |
| 2003/0095434 A1 | 5/2003 | Kuroda et al. | |
| 2004/0111553 A1* | 6/2004 | Conley | G06F 12/0246 711/103 |
| 2006/0203596 A1 | 9/2006 | Shiga | |
| 2006/0285397 A1* | 12/2006 | Nishihara | G06F 3/061 365/185.33 |
| 2007/0230245 A1 | 10/2007 | Watanabe et al. | |
| 2009/0161430 A1 | 6/2009 | Allen et al. | |
| 2009/0204852 A1* | 8/2009 | Diggs | G06F 11/008 714/42 |
| 2011/0066793 A1* | 3/2011 | Burd | G06F 11/1028 711/103 |
| 2012/0051136 A1* | 3/2012 | Kang | G11C 16/344 365/185.17 |
| 2012/0051138 A1* | 3/2012 | Kim | G11C 16/0483 365/185.17 |
| 2013/0128666 A1 | 5/2013 | Avila et al. | |

FOREIGN PATENT DOCUMENTS

| | | |
|---|---|---|
| JP | 2002-117692 | 4/2002 |
| JP | 2002-133894 | 5/2002 |
| JP | 2008-9932 | 1/2008 |
| JP | 2009-266280 | 11/2009 |
| JP | 2010-103255 | 5/2010 |
| JP | 2010-118530 | 5/2010 |
| JP | 2011-096341 | 5/2011 |

* cited by examiner

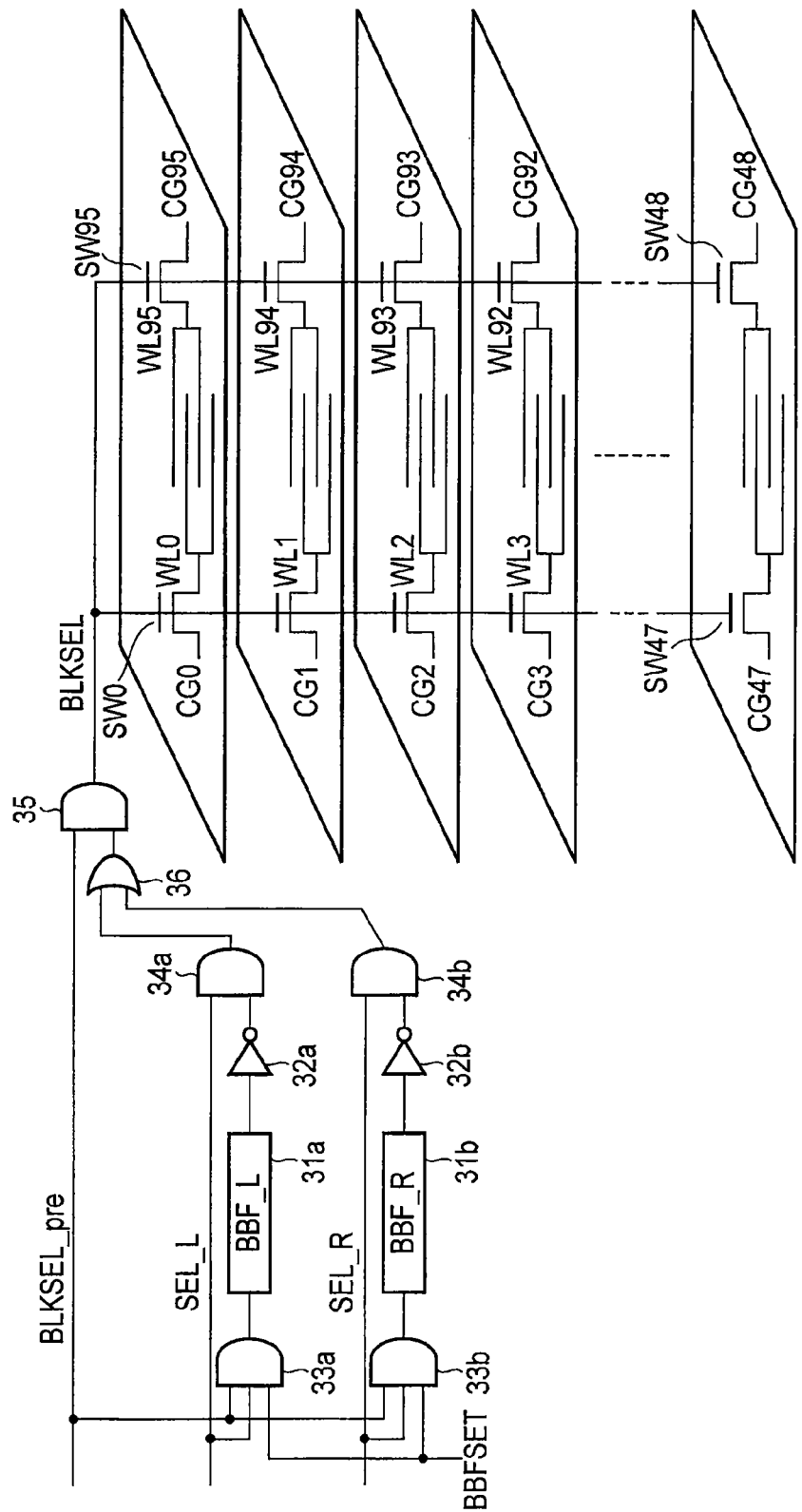
F I G. 6

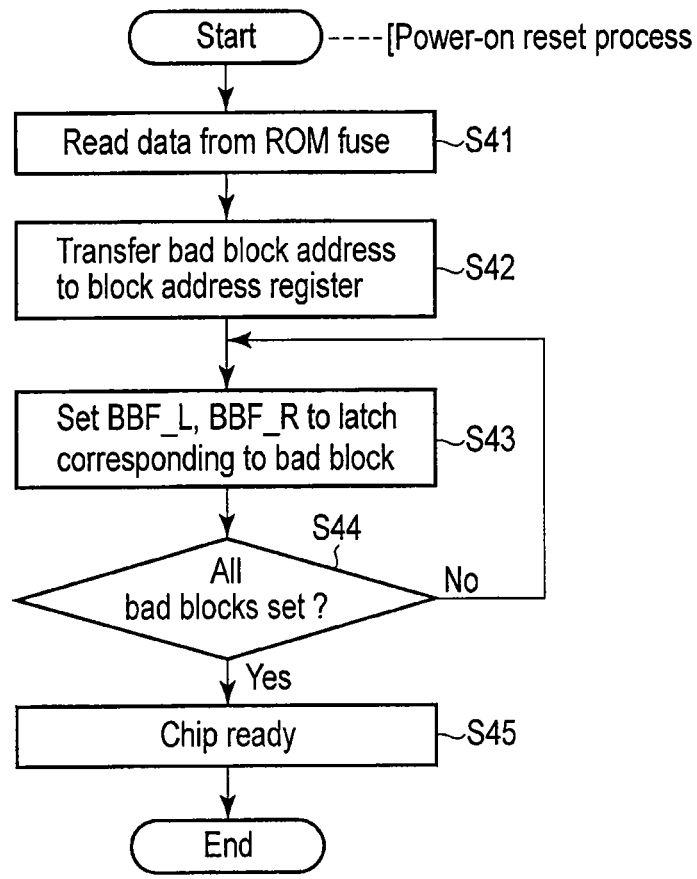

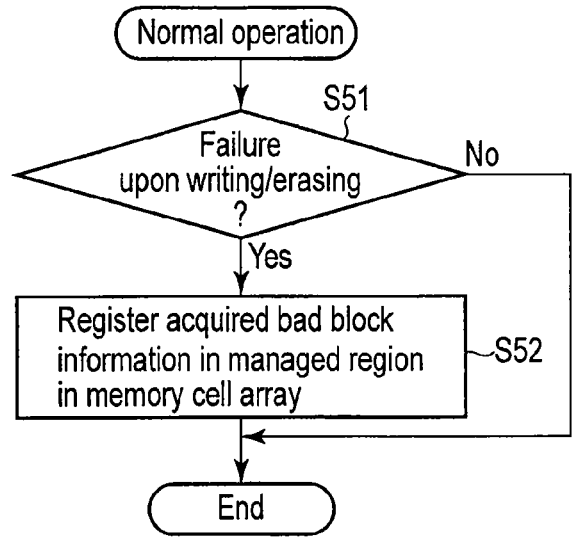
F I G. 1 0 A
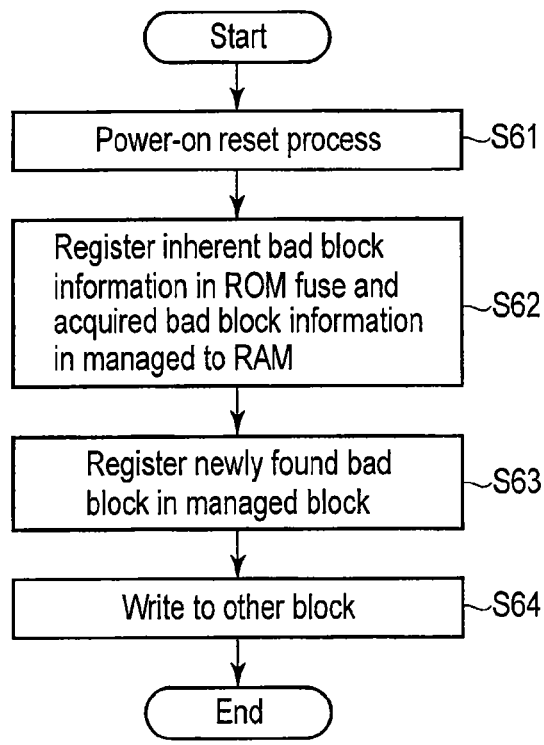
F I G. 1 0 B

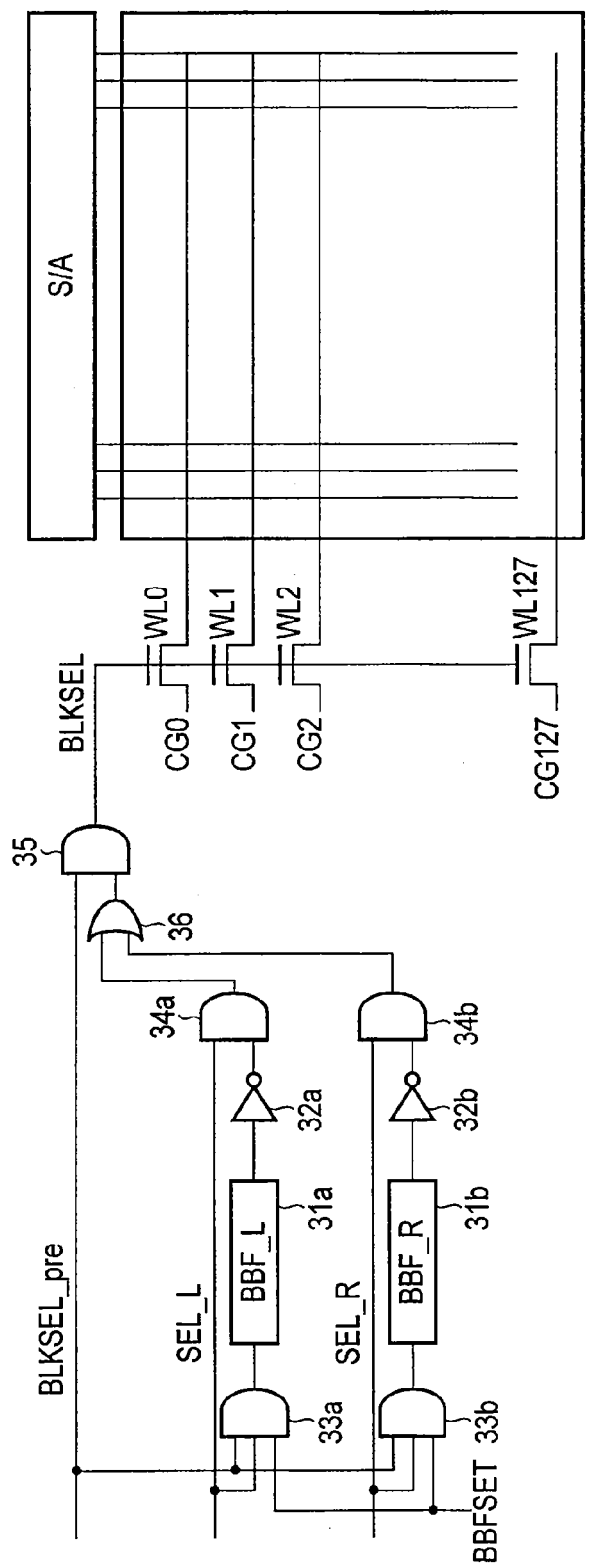
F I G. 12

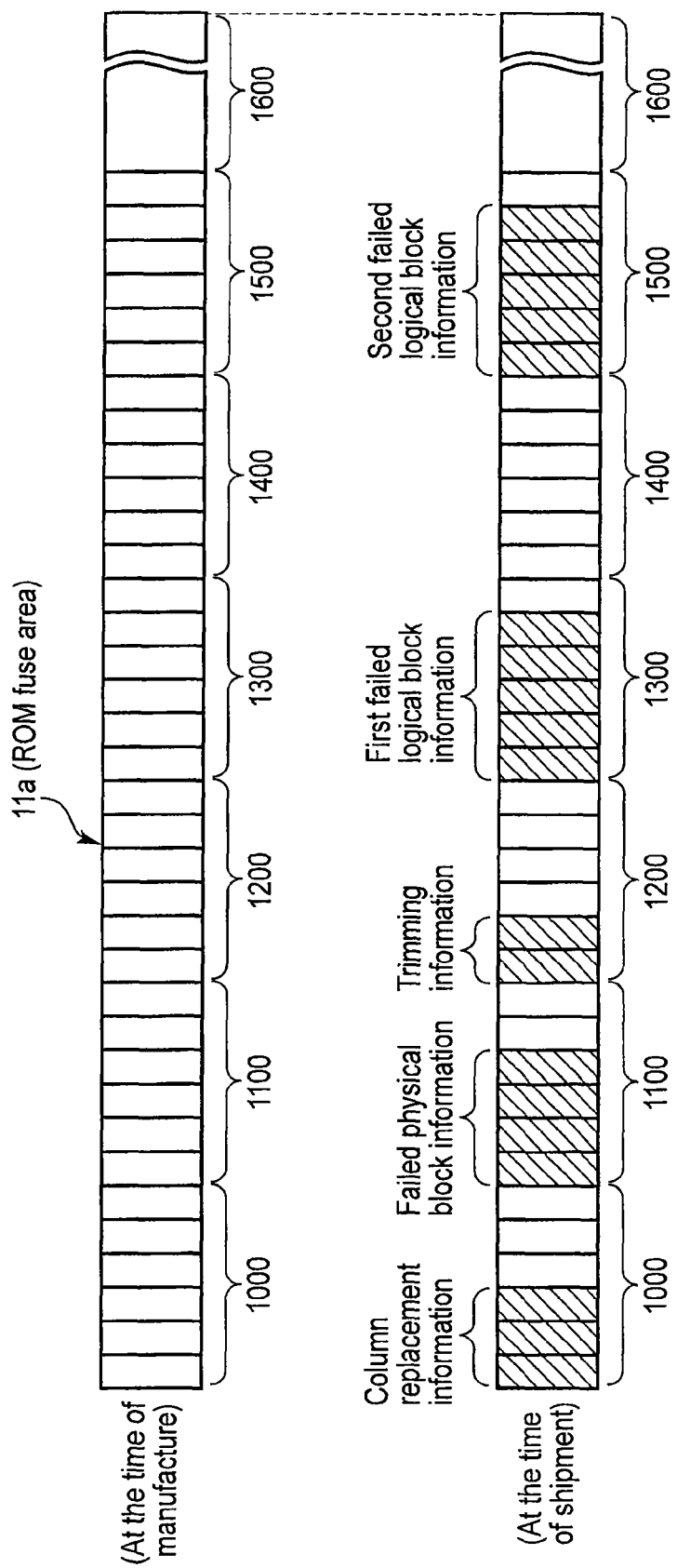
F I G. 16

FIG. 20A

Logical / physical conversion table 1 (Physical block)

| Logical address | Physical address Plane 0 | Physical address Plane 1 |
|---|---|---|
| 0 | 0 | 0 |
| 1 | 1 | 1 |
| 2 | 2 | 2 |
| 3 | 5 | 3 |
| 4 | 7 | 4 |
| 5 | 8 | 6 |
| 6 | 9 | 7 |
| 7 | 11 | 8 |
| 8 | 12 | 10 |
| 9 | 13 | 11 |
| 10 | 14 | 12 |

FIG. 20B

Logical / physical conversion table 2 (Logical block)

| Logical address | Physical address Plane 0 | Physical address Plane 1 |
|---|---|---|
| 0 | 4_0 | 5_2 |
| 1 | 4_1 | 5_3 |
| 2 | 4_3 | 5_4 |
| 3 | 4_4 | 5_5 |
| 4 | 4_5 | 5_6 |
| 5 | 4_6 | 5_7 |
| 6 | 4_7 | 5_2 |
| 7 | 6_0 | 5_2 |
| 8 | 6_2 | 5_2 |
| 9 | 6_3 | 9_0 |
| 10 | 6_4 | 9_1 |

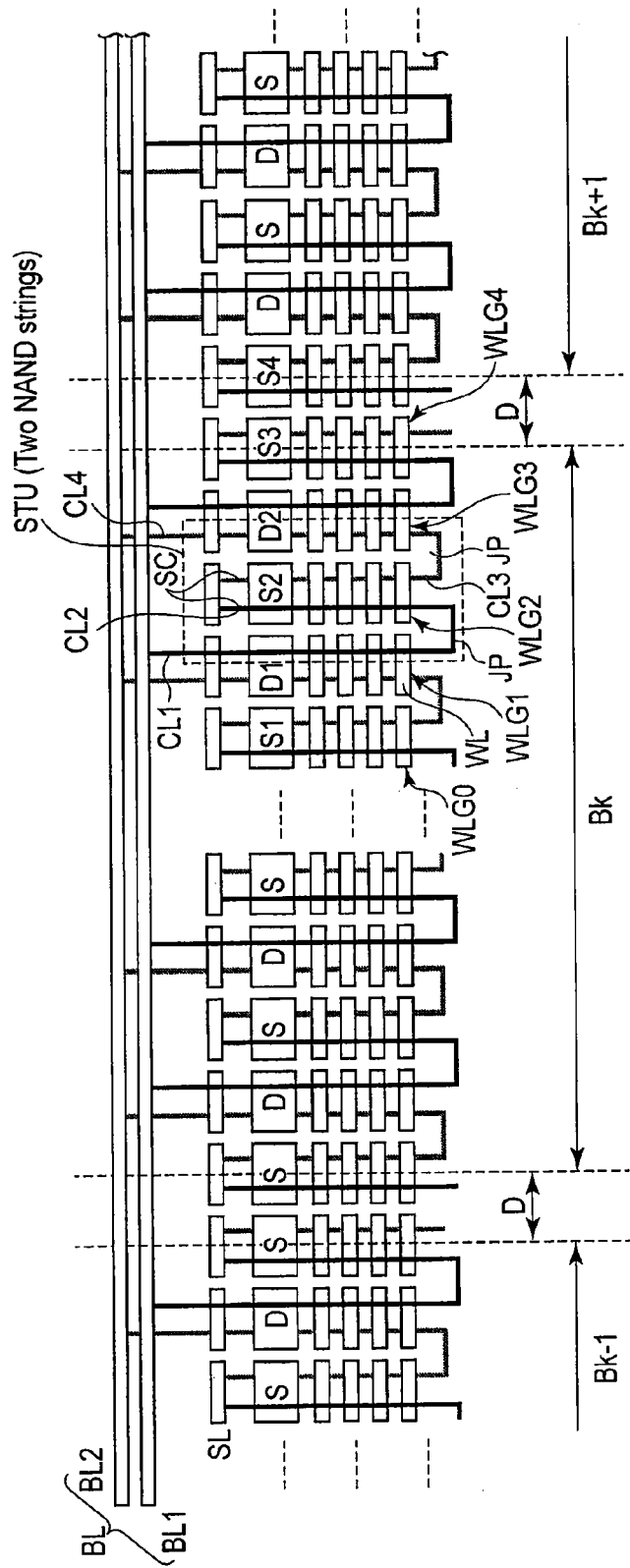
F I G. 21

NON-VOLATILE SEMICONDUCTOR MEMORY DEVICE

CROSS REFERENCE TO RELATED APPLICATIONS

This application is a continuation of and claims the benefit of priority under 35 U.S.C. §120 from U.S. Ser. No. 13/931,305 filed Jun. 28, 2013, which is a Continuation-in-Part of U.S. Ser. No. 13/242,902 filed Sep. 23, 2011 (now U.S. Pat. No. 8,526,241 issued Sep. 3, 2013), and claims the benefit of priority under 35 U.S.C. §119 from Japanese Patent Application No. 2011-004953 filed Jan. 13, 2011, the entire contents of each of which are incorporated herein by reference.

FIELD

Embodiments described herein relate generally to a non-volatile semiconductor memory device, for example, a NAND flash memory.

BACKGROUND

In the recent years, as an approach to improving the bit density of a NAND flash memory, a memory using a stacked NAND flash memory in which memory cells are stacked, a so-called bit-cost scalable (BiCS) flash memory, is being proposed.

BRIEF DESCRIPTION OF THE DRAWINGS

FIG. 6 is a block diagram showing a circuit configuration of a row decoder unit of the non-volatile semiconductor memory device of the first embodiment;

FIG. 8 is a diagram showing a failed block address map;

FIG. 9 is a flowchart showing an operation in a power-on reset process;

FIGS. 10A and 10B are flowcharts showing an example of a process for an acquired bad block that occurs after shipment;

FIG. 12 is a block diagram showing a circuit configuration of a row decoder unit of a non-volatile semiconductor memory device of a third embodiment;

FIG. 16 is a view showing an example of a format of information stored in a ROM fuse region;

FIGS. 20A and 20B are views showing examples of conversion tables of a logical address and a physical address;

FIG. 21 is a circuit diagram showing a part of a memory cell array according to a sixth embodiment;

DETAILED DESCRIPTION

Figure 1:
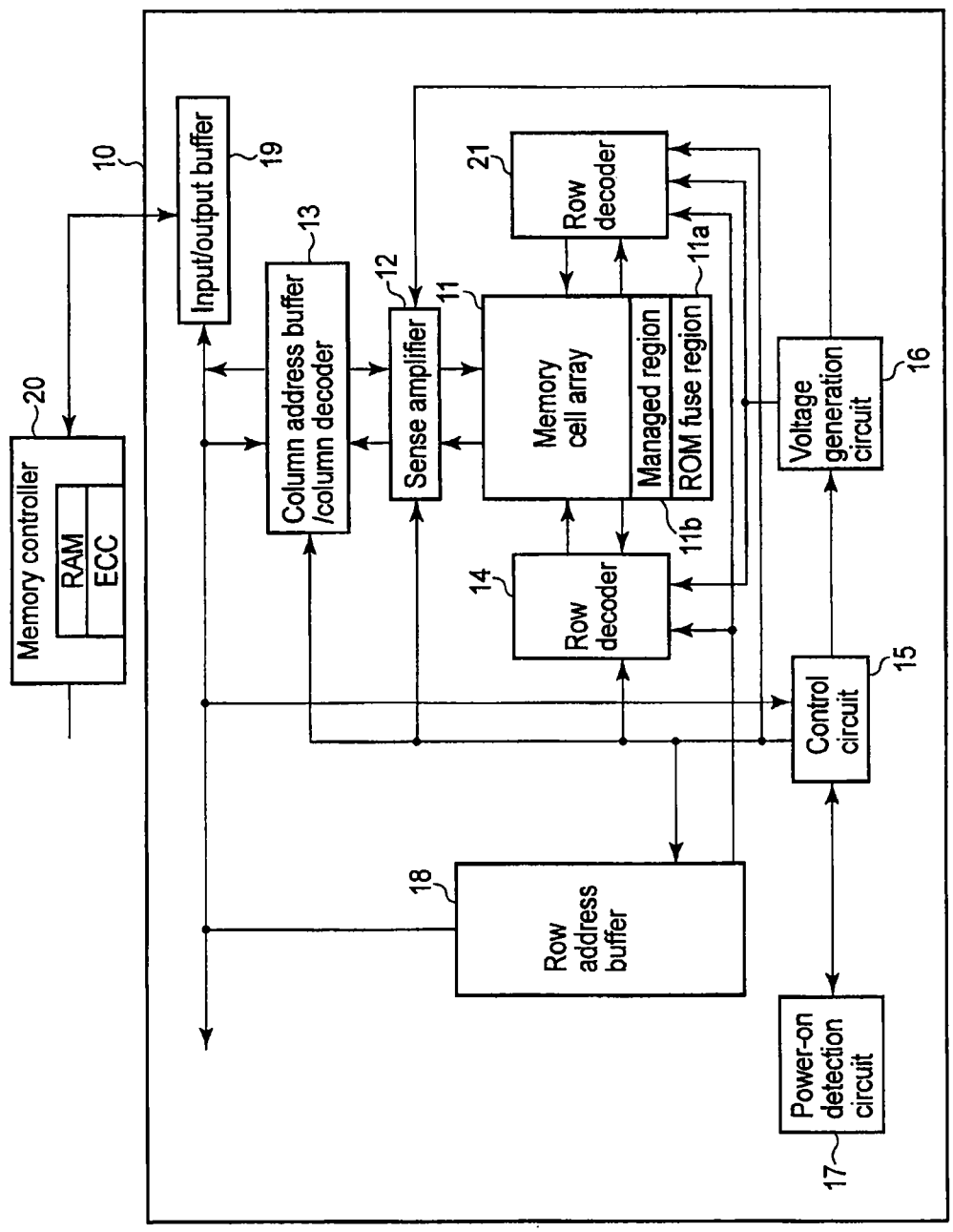
FIG. 1 is a block diagram showing a circuit configuration of a non-volatile semiconductor memory device of a first embodiment.

In general, according to one embodiment, a non-volatile semiconductor memory device includes a memory cell array and a memory region. The memory cell array has a plurality of physical blocks. Each of the plurality of physical blocks includes a plurality of string units. Each string unit has a plurality of NAND strings that shares a plurality of word lines connected to a plurality of memory cells, respectively. The memory region is disposed to one of the plurality of physical blocks. Each of the plurality of string units configures a first logical block, and when the first logical block is failed, the information of the first failed logical block is stored in a first region of the memory region.

Hereinafter, embodiments will be described with reference to the drawings. In all of the drawings, same reference signs are given to same components. Further, dimensional ratio of the drawings is not limited to the ratio shown in the drawings.

First Embodiment

Configuration of Non-Volatile Semiconductor Memory Device

FIG. 1 is a block diagram showing a circuit configuration of a three-dimensional stacked non-volatile semiconductor memory device of a first embodiment.

The three-dimensional stacked non-volatile semiconductor memory device of the present embodiment includes a BiCS flash memory 10 and a memory controller 20. Here, the BiCS flash memory 10 is provided with a memory cell array 11, a sense amplifier 12, a column address buffer/column decoder 13, row decoders 14 and 21, a control circuit 15, a voltage generation circuit 16, a power-on detection circuit 17, a row address buffer 18, and an input/output buffer 19.

As will be described later, the memory cell array 11 is a three-dimensional stacked non-volatile semiconductor memory device in which a plurality of memory cells is stacked in a vertical direction. A part of the blocks in the memory cell array 11 is used, for example, as a ROM fuse region 11a and a managed region 11b. In the ROM fuse region 11a, for example, column replacement information for replacing a failed column, parameters for determining respective operation modes, trimming results for generating respective voltages and bad block information indicating failed blocks are stored. Further, as will be described later, in the managed region 11b, bad block information indicating a bad block that includes an acquired failure is stored.

<Sense Amplifier and Column Address Buffer/Column Decoder>

As shown in FIG. 1, the sense amplifier 12 is connected to the memory cell array 11 via bit lines BL. The sense amplifier 12 performs reading data in the memory cell array 11 in a page unit upon reading, and writes data in the memory cell array 11 in the page unit upon writing.

Further, the sense amplifier 12 is also connected to the column address buffer/column decoder 13. The sense amplifier 12 decodes a select signal input from the column address buffer/column decoder 13, and selects and drives one of the bit lines BL.

The sense amplifier 12 also provides a function of a data latch retaining data upon the writing. The sense amplifier 2 of the present embodiment comprises a plurality of data latch circuits. For example, a sense amplifier adapted to a multilevel cell (MLC) that stores 2 bits of data in one cell comprises three data latches.

The column address buffer/column decoder 13 temporarily stores a column address signal that is input from the memory controller 20 via the input/output buffer 19, and outputs a select signal that selects one of the bit lines BL according to the column address signal to the sense amplifier 12.

<Row Decoder>

The row decoders 14 and 21 decode a row address signal that is input via the row address buffer 18, and selects and drives word lines WL and select gate lines SGD, SGS of the memory cell array. Further, the row decoders 14 and 21 comprise a portion that selects a block in the memory cell array 11 and a portion that selects a page.

Note that, the BiCS flash memory 10 of the present embodiment comprises an external input/output terminal I/O that is not shown, and transmission of data with the input/output buffer 19 and the memory controller 20 is performed via this external input/output terminal I/O. Address signals input via the external input/output terminal I/O are output to the row decoders 14 and 21 and the column address buffer/column decoder 13 via the row address buffer 18.

<Control Circuit>

The control circuit 15 controls a sequence control of data writing and erasing, as well as a read operation based on respective external control signals (a write enable signal WEn, a read enable signal REn, a command latch enable signal CLE, an address latch enable signal ALE, etc.) and a command CMD that are supplied via the memory controller 20. The control circuit 15 automatically performs an initialization operation responsive to receiving a power-on detection signal that is input from the power-on detection circuit 17.

<Voltage Generation Circuit>

A voltage generation circuit 16 is controlled by the control circuit 15, and generates respective internal voltages that are needed in the operations of writing, erasing and reading. This voltage generation circuit 16 comprises a boosting circuit for generating an internal voltage higher than a power voltage.

<Power-On Detection Circuit>

The power-on detection circuit 17 is connected to the control circuit 15. The power-on detection circuit 17 detects the power being turned on, and outputs a detection signal to the control circuit 15.

<Memory Controller>

The memory controller 20 outputs commands, etc. that are needed for operations of the BiCS flash memory 10, and performs reading, writing and erasing of the BiCS flash memory 10. This memory controller 20 includes a random access memory (RAM) and an error correcting code (ECC) circuit. The ECC circuit corrects an error included in data read from the memory cell array 11.

<Memory Cell Array>

Figure 2:
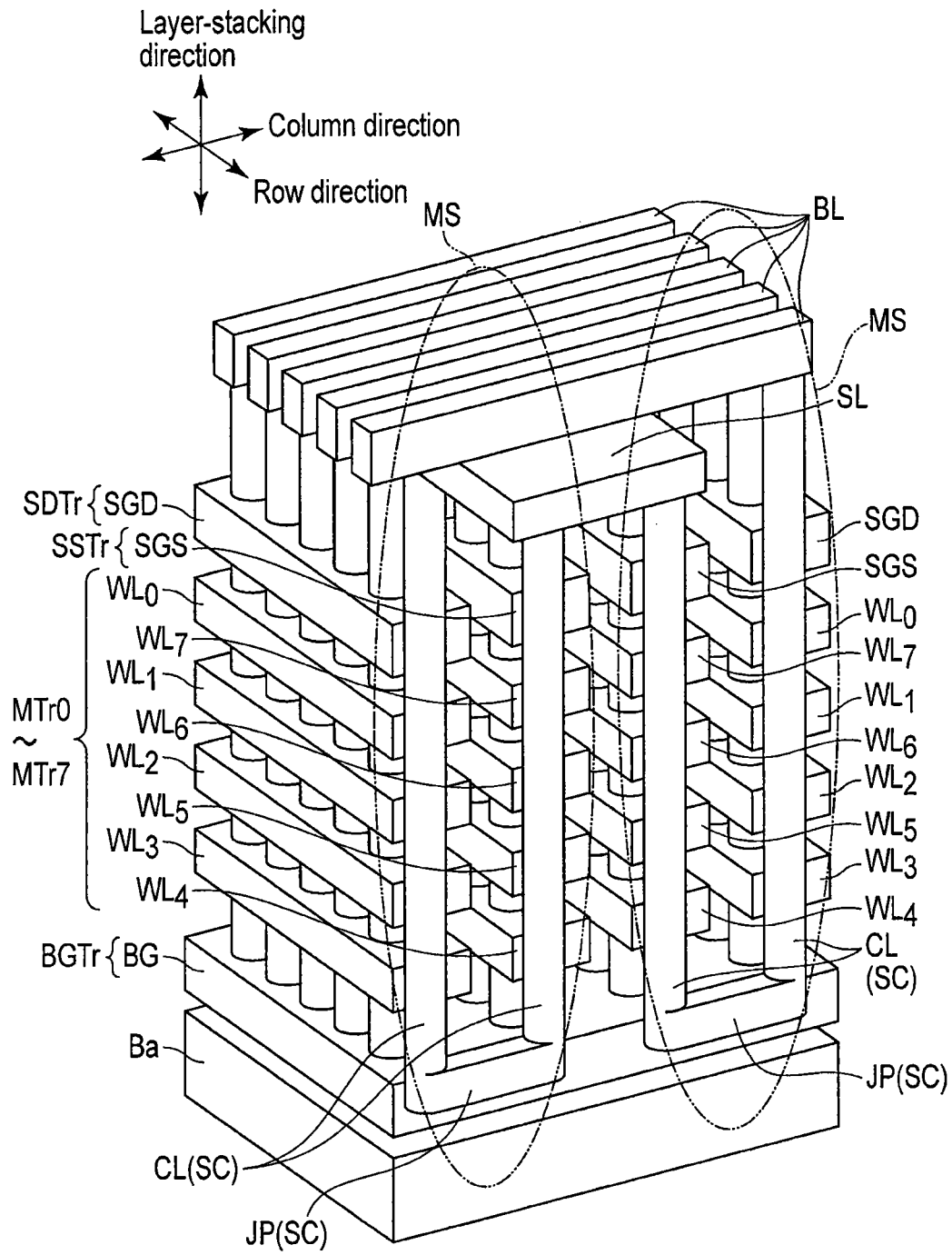
FIG. 2 is a perspective view showing an example of an element structure of a memory cell array of the non-volatile semiconductor memory device of the first embodiment.
Figure 3:
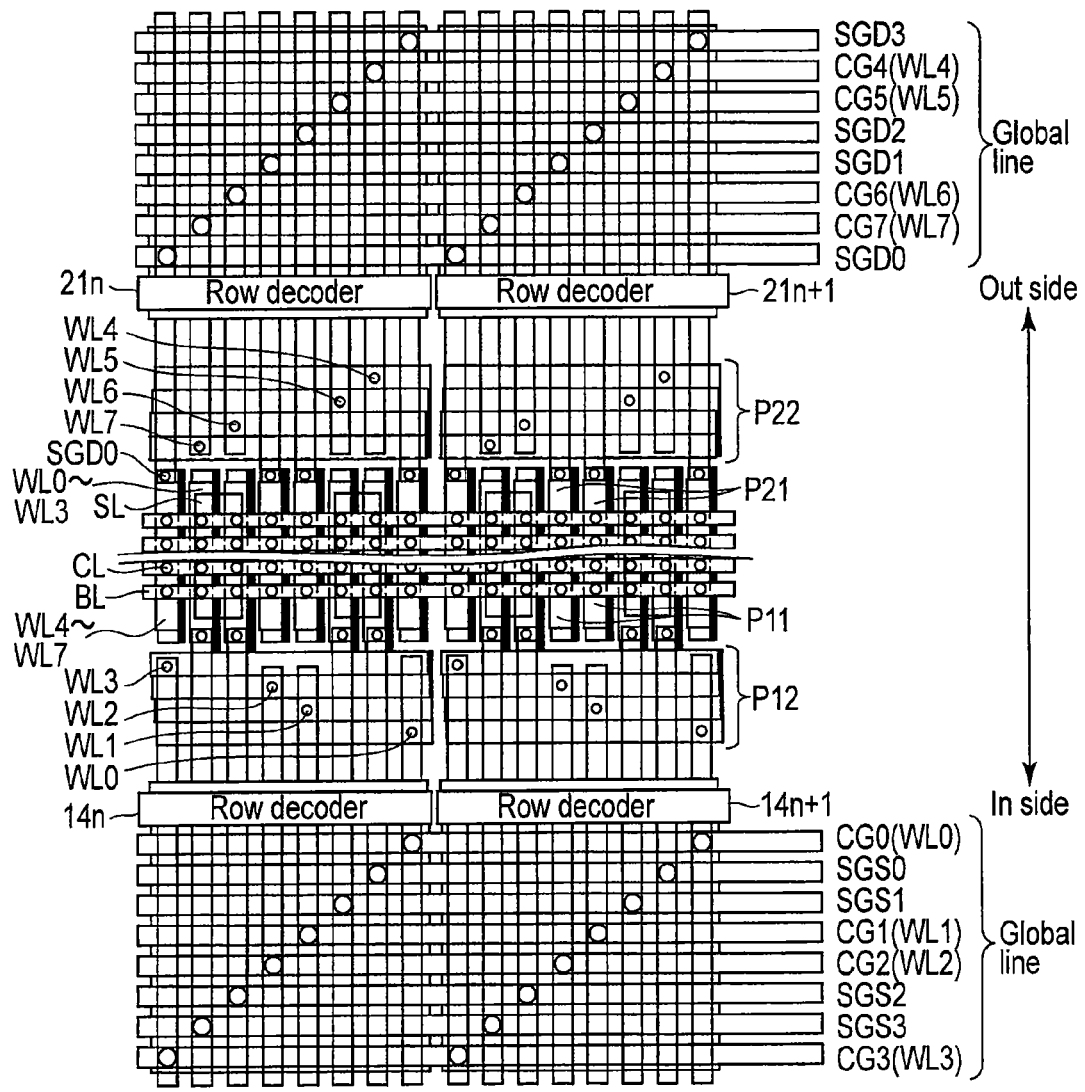
FIG. 3 is a top view showing a configuration of an electrode extracting portion of the memory cell array of FIG. 2.

FIG. 2 and FIG. 3 show the memory cell array 11 of the present embodiment. Note that, for the sake of simplicity of the explanation, FIG. 2 and FIG. 3 are depicted with the number of layers of the word lines WL being four layers.

FIG. 2 is a perspective view showing an example of an element structure of the memory cell array 11 of the present embodiment. The memory cell array of the present embodiment is a p-BiCS memory in which lower ends of a plurality of adjacent and serially connected memory cells are connected by transistors called pipe connections.

The memory cell array 11 comprises m×n cells (m and n being natural numbers) of NAND strings MS. FIG. 2 shows an example of m=6 and n=2. Each of the NAND strings MS has the lower ends of the adjacent and serially connected transistors (MTr0 to MTr7) connected in pipe connection, and at upper ends, source-side select transistors SSTr and drain-side select transistors SDTr are arranged.

In the non-volatile semiconductor memory device of the present embodiment, the memory transistors MTr (herein below referred to as memory cells) configuring the NAND strings MS are formed by stacking a plurality of semiconductor layers. Each of the NAND strings MS comprises a U-shaped semiconductor SC, word lines WL (WL0 to WL7), a source-side select gate line SGS, and a drain-side select gate SGD. Further, the NAND string MS comprises a back gate line BG.

The U-shaped semiconductor SC is formed in a U-shape as seen from a row direction. The U-shaped semiconductor SC comprises a pair of columnar sections CL extending in a substantially vertical direction relative to a semiconductor substrate Ba, and a joining section JP formed so as to join lower ends of the pair of columnar sections CL. Note that, the columnar sections CL may be circular pillars, or may be square pillars. Further, the columnar sections CL may be pillars having the shape of steps. Here, the row direction is a direction orthogonal to a layer-stacking direction, and a column direction that will be described later is a direction orthogonal to a vertical direction and the row direction.

The U-shaped semiconductor SC is arranged such that a straight line connecting center axes of the pair of columnar sections CL is parallel to the column direction. Further, the U-shaped semiconductor SC is arranged so as to be a matrix within a plane configured of the row direction and the column direction.

The word line WL in reach layer extends parallel to the row direction. The word line WL in reach layer is formed in a linear shape in the column direction with a certain interval, and electrically isolated from one another.

Gates of the memory cells (MTr0 to MTr7) provided at the same position in the column direction and arranged in the row direction are connected to the same word line WL. Each of the word lines WL is arranged substantially vertical to the NAND string MS.

The drain-side select gate SGD is provided above the topmost word line WL, and extends parallel to the row direction. The source-side select gate line SGS is provided above the topmost word line WL, and extends parallel to the row direction, as is similar to the drain-side select gate SGD.

Further, the source-side select transistor SSTr is connected to a common source line SL, and the drain-side select transistor SDTr is connected to the bit lines BL in the topmost layer.

FIG. 3 shows a top view showing a layout of an extracting portion of the word lines WL, and shows two blocks (Block n, Block n+1).

As described above, in regards to one NAND string formed on one U-shaped semiconductor SC, a group of word lines WL0 to WL3 provided on one of the columnar sections CL and a group of word lines WL4 to WL7 provided on the other of the columnar sections CL are extracted in opposite directions with respect to each other. In the example of FIG. 3, the drain-side select gate SGD is extracted, for example, to an Out side, and the source-side select gate line SGS is extracted, for example, to an In side. The reason for extracting in the opposite directions as above is to suppress an increase in the number of metal interconnect layers.

Since the p-BiCS memory as above includes four layers of word lines WL, one string is configured of eight word lines WL. Each of word lines WL0 to WL3 and WL4 to WL7 is formed in a comb shape. That is, word lines WL0 to WL3 comprise main bodies P11 of the word lines to which the columnar section CL is provided, and are provided orthogonal to the bit lines BL respectively, and word lines WL4 to WL7 comprise main bodies P12 of the word lines to which the columnar section CL is provided, and are provided orthogonal to the bit lines BL respectively. The main bodies P11 of word lines WL0 to WL3 and the main bodies P12 of word lines WL4 to WL7 are respectively arranged every two lines in each and common layer. One ends (In side end portions) of the plurality of main bodies P11 of word lines WL0 to WL3 are commonly connected respectively by a plurality of joining sections P12 arranged along the bit lines BL. Further, the other ends (Out side end portions) of the plurality of main bodies P21 of word lines WL4 to WL7 are commonly connected respectively by a plurality of joining sections P22 arranged along the bit lines BL.

In the In side of each block BLKn, BLKn+1, row decoders 14n, 14n+1 are provided, respectively, and in the Out side of each block BLKn, BLKn+1, row decoders 21n, 21n+1 are provided.

That is, in the outside of the row decoders 14n, 14n+1, global interconnects CG0 to CG3 and source-side select gate lines SGS0 to SGS3 are arranged. The global interconnects CG0 to CG3 are connected to the word lines WL0 to WL3 via extended lines connected to the row decoders 14n, 14n+1. The source-side select gate lines SGS0 to SGS3 are connected source-side select gate lines SGS0 to SGS3 having the same name via extended lines connected to the row decoders 14n, 14n+1.

Further, in the outside of row decoders 21n, 21n+1, global interconnects CG4 to CG7 and the drain-side select gate lines SGD0 to SGD3 are arranged. The global interconnects CG4 to CG7 are connected to the word lines WL4 to WL7 via extended lines connected to the row decoders 21n, 21n+1. The drain-side select gate lines SGD0 to 3 are connected to the drain-side select gate lines SGD0 to SGD3 having the same name via extended lines connected to the row decoders 21n, 21n+1. Furthermore, in the In-side and Out-side, the row decoder corresponding to an unselected block becomes inactive state. Thus, voltage is not supplied to the memory cell array the memory cell array becomes a floating state.

Figure 4:
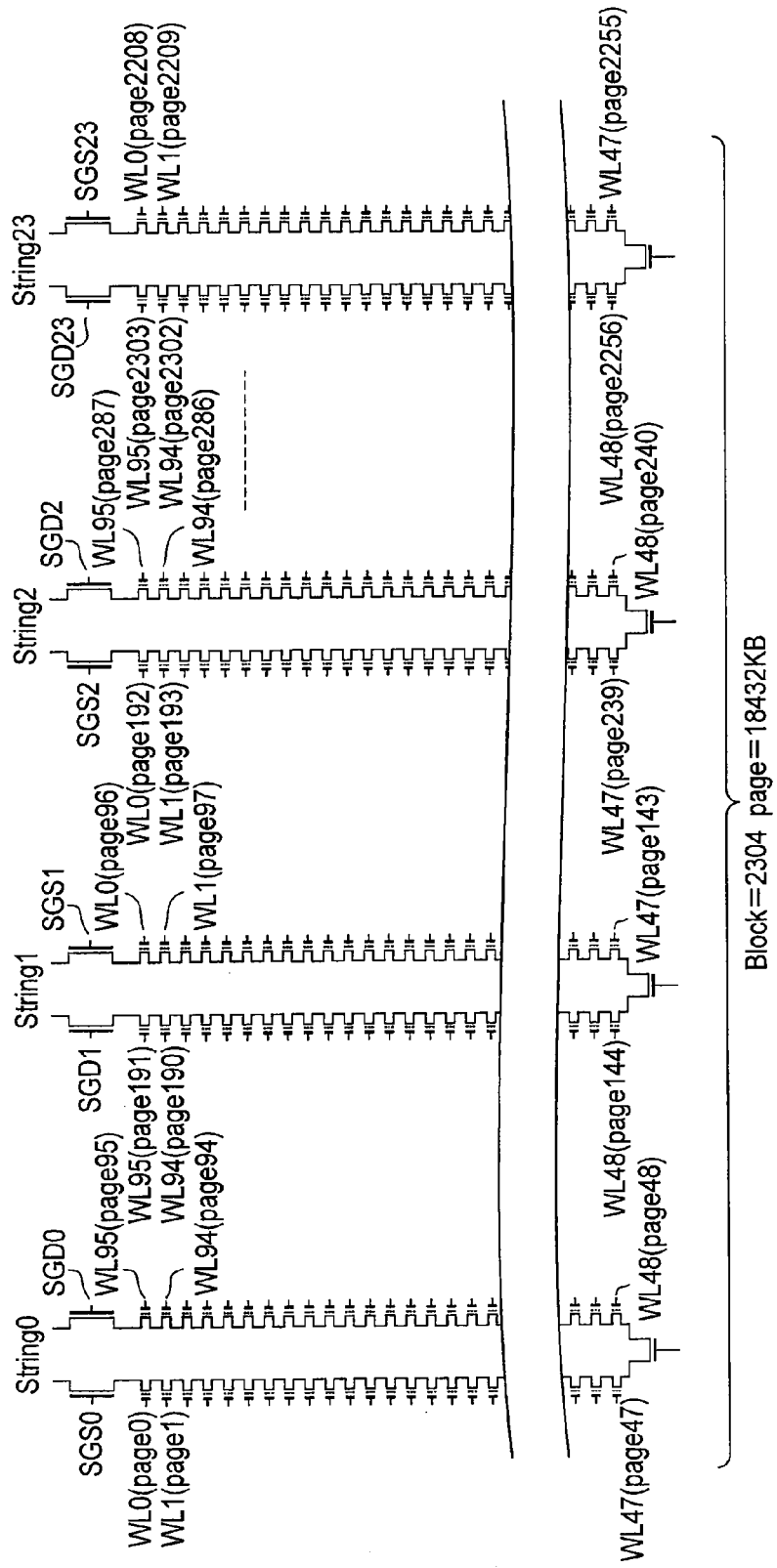
FIG. 4 is a diagram showing a block configuration of a typical p-BiCS memory.

FIG. 4 shows a configuration of a plurality of U-shaped strings connected to one bit line of one block of a typical p-BiCS memory. This p-BiCS memory comprises 48 layers of word lines, and 24 U-shaped strings are connected to one bit line BL. A U-shaped string connected to each of a plurality of bit lines BL configures one block. When a page length is 8 KB and being a single-level cell (SLC) storing 1 bit per one memory cell, a capacity of one block is 18432 KB. This is extremely large compared to a NAND flash memory having 64 word lines per one block and the page length of 8 KB (the capacity per block is 512 KB).

Further, in a typical planar NAND flash memory, for example, in a case where adjacent word lines are short circuited, a block including these word lines becomes incapable of being used for being a bad block (failed block). In a case of adapting this kind of typical control of a NAND flash memory to a p-BiCS memory having a large block capacity, a large capacity becomes incapable of being used. Because of this, the p-BiCS memory has a possibility that the available capacity is reduced at a speed of several tens of times that of the typical NAND flash memory because of a bad block.

Thus, the present embodiment is configured as below in order to prevent the decrease in the available capacity.

Herein below, in each embodiment, a set of strings having common word lines is referred to as a physical block (physical block). Further, in each embodiment, a block does not mean a unit of erasure. The erasure of data can be performed, for example, in a unit of strings sharing a source line SL, or other units.

Figure 5:
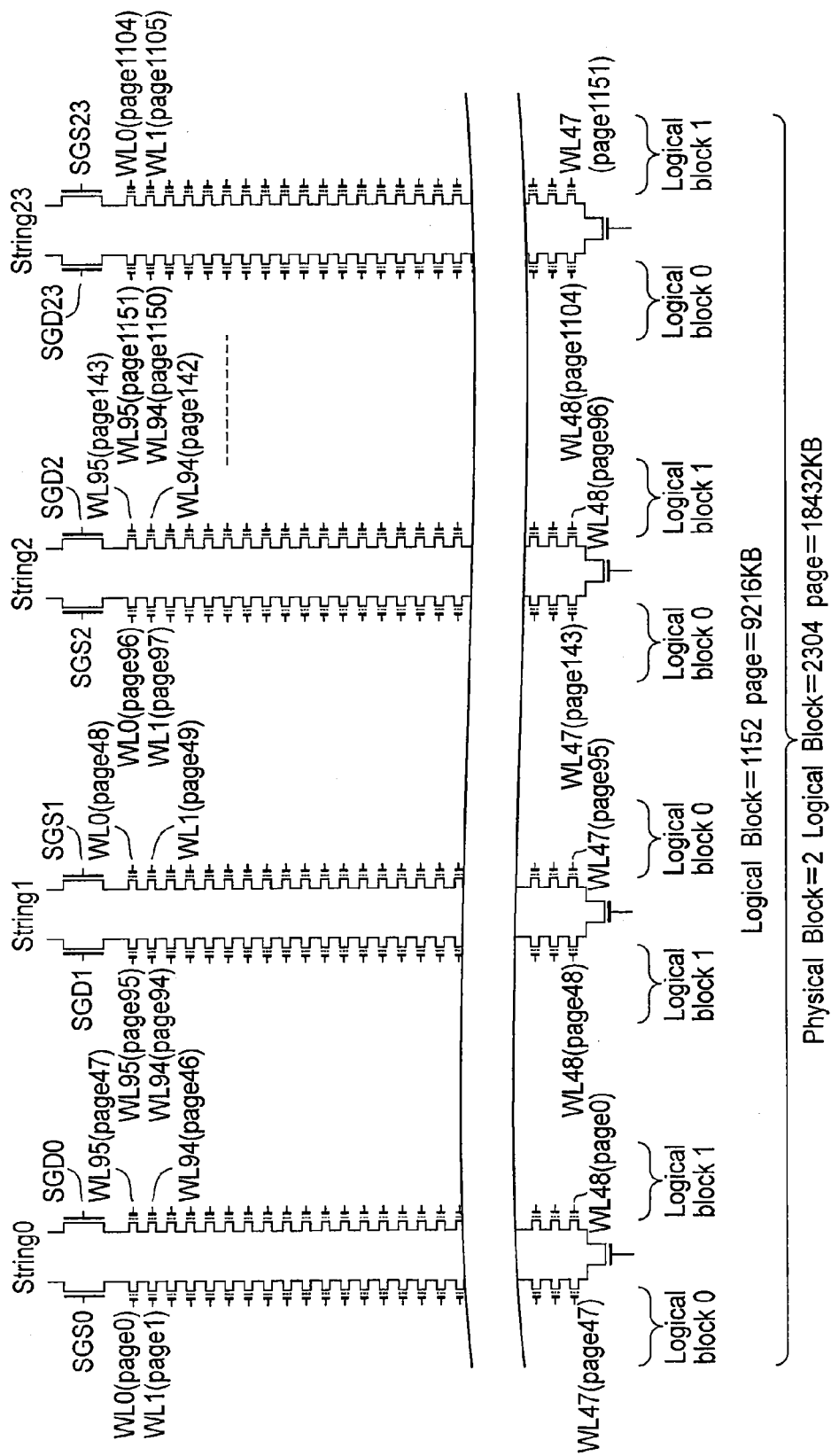
FIG. 5 is a diagram showing a block configuration of a p-BiCS memory of the first embodiment.

FIG. 5 shows an example of a configuration of a plurality of U-shaped strings connected to one bit line in one physical block of the present embodiment. The p-BiCS memory of the present embodiment comprises a plurality of logical blocks (logical blocks) in a physical block. For example, a plurality of memory cells commonly connected to a word line drawn out in the same direction configure one logical block. As shown in FIG. 5, a plurality of memory cells connected to word lines WL0 to WL47 configure a logical block 0, and a plurality of memory cells connected to word lines WL48 to WL95 configure a logical block 1. That is, these two logical blocks (also referred to as first logical blocks. Herein below, logical blocks used in the first embodiment represent the first logical blocks) configure the physical block. These two logical blocks are selected and driven independently by the row decoder.

According to this configuration, for example, in between different layers, for example, in logical block 0, in the case where the adjacent word lines are short circuited, only logical block 0 is determined as the bad block, and logical block 1 can be determined as a normal block. By configuring as above, it becomes possible to suppress the capacity that becomes incapable of using to ½.

Thus, the row decoder of the present embodiment provides two latches that correspond to the respective ones of the two logical blocks and that retain, for example, two flags (BBF_L, BBF_R) indicating the bad blocks.

FIG. 6 shows an example of a block decode included in the row decoder of the present embodiment. As shown in FIG. 6, the block decoder is configured of latch circuits 31a, 31b respectively retaining flags BBF_L and BBFR, inverters 32a, 32b, AND gates 33a, 33b, 34a, 34b, 35 and an OR gate 36.

The AND gate 33a inputs a block select signal BLKSEL_pre, a signal SEL_L including special conditions such as a test, and a signal BBFSET, and outputs them to the latch circuit 31a. The AND gate 33b inputs a block select signal BLKSEL_pre, a signal SEL_R including special conditions such as a test, and a signal BBFSET, and outputs them to the latch circuit 31b.

Outputs of the latch circuit 31a are supplied to one of input terminals of the AND gate 34a via the inverter 32a. Signal SEL_L is supplied to the other of the input terminals of the AND gate 34a. Outputs of the latch circuit 31b are supplied to one of input terminals of the AND gate 34b via the inverter 32b. Signal SEL_R is supplied to the other of the input terminals of the AND gate 34b.

Outputs of the AND gates 34a, 34b are supplied to the OR gate 36, and an output of the OR gate 36 is supplied to one of input terminals of the AND gate 35. Further, the block select signal BLKSEL_pre is supplied to the other of the input terminals of the AND gate 35. Consequently, an output of the AND gate 35 is output as a block select signal BLKSEL. The AND gates 34a, 34b and 35 and the OR gate 36, for example, configures the drive circuit of the word lines.

Flags BBF_L, BBF_R indicating failures are, for example, set in the latch circuits 31a, 31b in a power-on reset process when power is turned on. Because of this, a failed physical block address is stored in the ROM fuse region 11a of the memory cell array 11. The failed physical block address stored in the ROM fuse region 11a is read in the power-on reset process as will be described later. Based on this address, the latch circuits 31a, 31b are set.

Further, in the ROM fuse region 11a, as will be described later, a flag indicating a failure and a logical block address, which is a unit by which the failed blocks are dealt, are retained in association based, for example, on a result of a die sorting test.

In the memory cell array with the block configuration shown in FIG. 5, as shown in FIG. 6, word lines WL0 to WL47 that are extracted toward one side (the in side) are connected to control signal lines CG0 to CG47 via switching transistors, respectively. That is, word line WL0 is connected to CG0 via the transistor SW0, word line WL1 is connected to CG1 via the transistor SW1, and word line WL47 is connected to CG47 via the transistor SW47.

Further, word lines WL48 to WL95 that are extracted toward the other side (the Out side) are connected to control signal lines CG48 to CG95 via switching transistors, respectively. That is, word line WL95 is connected to CG95 via the transistor SW95, word line WL94 is connected to CG94 via the transistor SW94, and word line WL48 is connected to CG48 via the transistor SW48. Respective gates of the transistors SW0 to SW95 are commonly connected to an output terminals of the AND gate 35.

Note that, the control signal lines CG0 to CG95 are connected to a page decoder (not shown) for selecting a page.

Here, signal SEL_L is a signal that is high when word lines WL0 to WL47 are selected in a user mode such as a write operation, read operation, erase operation, etc. Similarly, signal SEL_R is a signal that is high when word lines WL48 to WL95 are selected in the user mode.

In the present embodiment, for example, when word lines WL0 and WL1 are short circuited, flag BBF_L indicating the failure is set in the latch circuit 31a corresponding to logical block 0, and the latch circuit 31a is made high. That is, signals BLKSEL_pre, SEL_L, and BBFSET are high, and high is set in the latch circuit 31a.

Accordingly, for example, in a case where one of word lines WL0 to WL47 of logical block 0 is to be selected in the write operation, and signals BLKSEL_pre, SEL_L are high, since the output signal from the latch circuit 31a is high, the block select signal BLKSEL to be output from the AND gate 35 is not made high. Accordingly, an unselected state occurs in a physical block unit, where all of the word lines WL of logical blocks 0 and 1 retain floating states, and no undesirable influence is imposed on other components.

On the other hand, when word lines WL48 to WL95 of this physical block are to be selected, and signals BLKSEL_pre, SEL_R are high, since an output signal of the latch circuit 31b is low, the block select signal BLKSEL to be output from the AND gate 35 is made high, and the physical block is brought to be in a selected state. At this occasion, $V_{PGM}$ is applied to the selected WL via one of the transistors SW48 to SW95, and voltages corresponding to the boost options such as VISO/VGP/VPASS are transferred to the word lines around the selected word line.

Here, VISO is, for example, a voltage for channel separation that is lower than Vpass that turns on a memory cell in an erased state, and is higher than VISO. Further, in the program operation, in the case where word lines WL48 to WL95 of logical block 0 are selected, Vpass is applied to all of word lines WL0 to WL47. This is because, for example, word line WL0 is apart from word lines WL48 to WL95, and there is no need for a control to improve a boost efficiency. As a result, it can be expected that even if word lines WL0 and WL1 are short circuited, there will not be any problem.

Figure 7:
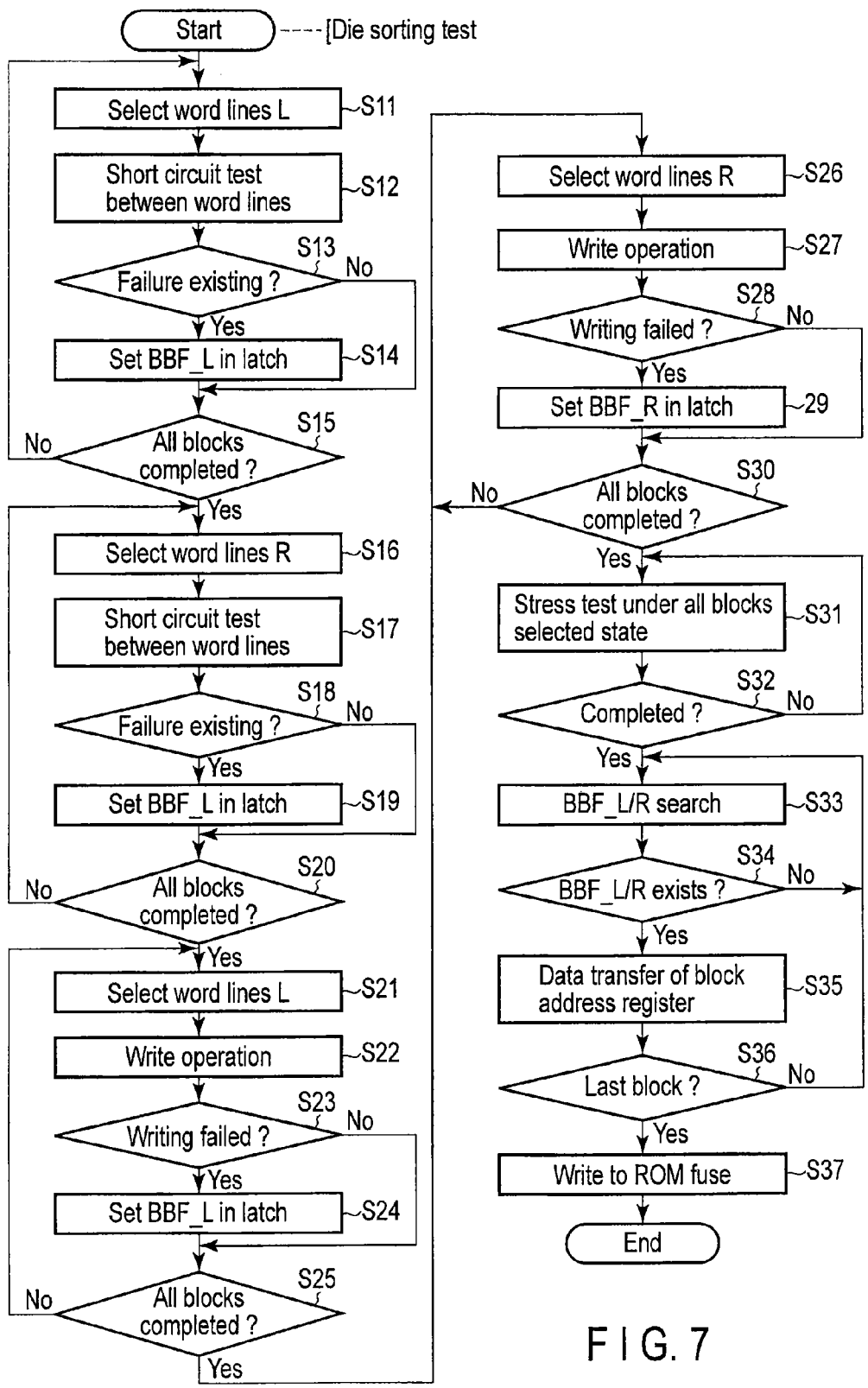
FIG. 7 is a flowchart showing an operation in a die sorting test.

FIG. 7 shows an operation upon a die sorting test. In order to perform the above operation, in the die sorting test, various tests are performed by a tester, and a bad block is detected from the memory cell array 11. An address of the detected bad block is stored in the ROM fuse region 11a.

As aforementioned, word lines WL0 to WL47 and word lines WL48 to WL95 shown in (FIG. 4) register the bad block using different latch circuits in the common row decoder. Since there is the need to perform the determination of good/bad blocks in a unit by which the bad block is to be registered, in the die sorting test, word lines WL0 to WL47 and word lines WL48 to WL95 need to be tested separately. Here, word lines WL0 to WL47 will be termed word lines L for the sake of simplicity, and word lines WL48 to WL95 will be termed word lines R in the below explanation.

In the die sorting test, firstly, for example, word lines L of logical block 0 are selected (S11), and a short circuit test between adjacent word lines is performed (S12).

Specifically, the short circuit test is performed in a state where all of the memory cells connected to word lines R are set at a certain threshold voltage, and all of the memory cells connected to the selected word lines L are set at an erased level. The certain threshold voltage is a level that is higher than, for example, the erased level (negative threshold voltage), and lower than Vread (a voltage capable of causing the unselected cell to be in conducted states during reading), for example, about 3 V. In this state, Vread, for example, 5 V, is applied to word lines R, and ground potential Vss is applied to word lines L. Because of this, all of the memory cells connected to word lines R, L are brought to the on-state.

In this state, when word lines L and word lines R are normal, charges on the bit lines are discharged via the memory cells in the on-state. Accordingly, the bit lines are made low.

Further, in a case where a short circuited portion exists in word lines L or word lines R, memory cells in an off-state occurs since Vread stops being applied to the gate electrodes of the memory cells connected to word lines L or word lines R. Accordingly, in this case also, the charges on the bit lines are not discharged, and the bit lines are kept high.

Potential of the above bit lines is detected by the sense amplifier. That is, the output of the sense amplifier is low when the word lines are normal, and is high when short circuited word lines are detected.

As a result of the above test, in the case where word lines L in the short circuited state are detected, flag BBF_L is set in the latch circuit 31*a* of the logical block that includes word lines L (S13, S14). Specifically, a BBF set command is issued by the tester, and flag BBF_L is set in the latch circuit 31*a* of logical block 0 that is currently being selected. That is, in the p-BiCS memory, for example, signals BLKSEL_pre, SEL_L, and BBFSET are high, and high flag BBF_L is set in the latch circuit 31*a*.

The testing operation that selected the above word lines L is performed for all of the logical blocks (S15 to S11).

On the other hand, in the case where the testing operation that selected word lines L for all of the logical blocks is completed, similar operation as above is performed in the state of word lines R being selected (S16 to S19). As a result, in the case where word lines R in the short circuited state are detected, flag BBF_R is set in the latch circuit 31*b* of the logical block that includes word lines R. The testing operation that selected the above word lines R is performed for all of the logical blocks (S16 to S20).

In the case where the testing operation that selected word lines R for all of the logical blocks is completed, one word line among word lines L of one logical block is selected (S21), and a normal write operation is performed (S22).

In the write operation, in the tester, a write command, address, data and an execution command for writing are generated. Here, for example, in a case with a chip having 1024 logical blocks, block addresses are set in a 10-bit block address register, and a corresponding logical block is brought to be in an active state.

Next, after the write operation is completed, a status read is performed, and the status of the non-volatile semiconductor memory device is checked (S23). As a result, when the writing fails, a BBF set command is issued by the tester, and flag BBF_L is set in the latch circuit 31*a* of the logical block that includes word lines L (S24). At this occasion, in the latch circuit 31*a*, in the case where flag BBF_L is already set by the short circuit test of the word lines, even if writing is attempted on word lines L, the block select signal BLKSEL is not made high, and the write operation cannot be performed. As a result, flag BBF_L is set anew.

Note that, in a case where an open exists in the word lines, the logical block including this word line fails in its writing. Because of this, the determination on a bad book can be performed.

The above operation is performed for all of the logical blocks (S25 to S21). In the case where the write operation that selected word lines L for all of the logical blocks is completed, similar operation as above is performed in the state of word lines R being selected (S26, S27). As a result, in the case where the writing fails, the BBF set command is issued by the tester, and flag BBF_R is set in the latch circuit 31*b* of the logical block that includes word lines R (S28, S29). At this occasion, in the latch circuit 31*b*, there are cases in which flag BBF_R is already set by the short circuit test of the word lines. In the case where flag BBF_R is already set, even if writing is attempted on word lines R, the block select signal BLKSEL is not made high, and the write operation cannot be performed. As a result, flag BBF_R is set anew.

The above operation is performed for all of the logical blocks (S30 to S26). In the case where the write operation that selected word lines R for all of the logical blocks is completed, it means that flag BBF_L or BBF_R is set in the latch circuit 31*a* or 31*b* corresponding to the failed block.

Accordingly, by setting flag BBF_L or BBF_R in the latch circuit 31*a* or 31*b* corresponding to the failed block, a stress test, etc. becomes capable of being performed in the state where word lines L or word lines R are selected (S31).

This stress test is a test in which, for example, Vdd (2.5 V) is applied to word lines R and, for example, Vpass (8 V) is applied to word lines R, and screens minor leaks by leaving them unattended over a long period of time. At this occasion, in a case where a logical block that has a short circuit between word lines R and word lines L exists, and flag BBF_L or BBF_R is not set in the latch circuit 31*a* or 31*b* corresponding to that logical block, it means that a predetermined stress of Vdd-Vpass cannot be applied not only to this logical block, but also to all of the logical blocks. Accordingly, it becomes essential to set flag BBF_L or BBF_R at a step prior to the die sorting test.

After the above stress test is completed (S32), flags BBF_L and BBF_R are searched (S33, S34). In this case, firstly, an access is made in order from logical block 0, and whether or not flags BBF_L and BBF_R are set in the corresponding latch circuit 31*a* or 31*b* is detected. In the case where flags BBF_L and BBF_R are set, data of the logical block address register at that time (bad block address) is transferred to the data latch circuit not shown of the sense amplifier 12 (S35). This operation is continued to the last logical block (S36), and all of the failure information is transferred to the data latch circuit of the sense amplifier 12. At this occasion, the column replacement information for replacing the failed column, the parameters for determining the respective operation modes, the trimming results for generating the respective voltages are also transferred to the data latch circuit of the sense amplifier. After all of the information is transferred to the data latch circuit, the data in the data latch circuit is programmed to the ROM fuse region 11*a* of the memory cell array 11 (S37).

FIG. 8 shows a failed block address map. As shown in FIG. 8, in this address map, for example, of the 2-bits retained in a region A, the 1-bit corresponding to R corresponds to the information of flag BBF_R (indicating a failure by "1" and a normality by "0"), and the 1-bit corresponding to L corresponds to the information of flag BBF_L. That is, in a case where word lines in the short circuited state are detected or a page in which the write operation cannot be performed is detected, "1" is set corresponding to the detected logical block address.

In FIG. 8, "0" denotes the normality, and "1" denotes the failure. For example, in the region shown as A, a logical block (Block) 204 has word lines R as "0" and word lines L as "1", and a logical block 435 has word lines R as "1" and word lines L as "0". A logical block 687 has both word lines R and word lines L as "1". Because of this, in the region A of the logical block 687, since the test results for word lines R and L are both "1", it can be understood that there is the possibility that word lines R and word lines L are short circuited.

FIG. 9 shows an operation in an example of setting flags BBF_R and BBF_L in the power-on reset process of the p-BiCS memory of the present embodiment. For the sake of a simple explanation, only the settings of the flags in the power-on reset process will be explained.

When the power-on detection circuit 17 detects that the power has been turned on, the power-on reset process as an initialization operation is performed by the control circuit 15.

In this power-on reset process, the bad block addresses stored in the ROM fuse region 11a in the memory cell array 11 are read, and one of flags BBF_L and BBF_R is set in one or both of the latch circuits 31a, 31b of the corresponding logical block.

Specifically, the bad block addresses, column replacement information, and trimming information are read from the ROM fuse region 11a, and are retained in a data latch circuit not shown of the sense amplifier 12 (S41).

Of these read data, the column replacement information is transferred to a circuit configured to relieve the failed column, and the trimming information is supplied to the voltage generation circuit 16. Further, the bad block addresses are transferred to the block address register (S42). As aforementioned, the block address register is configured by 10 bits in the case where the memory cell array 11 has 1024 logical blocks. By having the block addresses and the bad block addresses set in this block address register, logical blocks of the corresponding addresses are brought to the selected state.

When the logical block is set in the selected state, signal BBFSET shown in FIG. 6 is issued, and one of flags BBF_L and BBF_R is set in one or both of the latch circuits 31a, 31b corresponding to the bad block (S43). Accordingly, in the case where flag BBF_L or BBF_R is set, the logical block cannot be selected until flag BBF_L or BBF_R is reset.

The setting operation of the above flags BBF_L and BBF_R is repeated for a same number of times as a number of the bad blocks registered in the ROM fuse region 11a (S44, S43).

When the setting of above flags BBF_L and BBF_R is completed, the chip is brought to be in a chip ready state in which accesses can be made, and becomes capable of receiving commands from a controller (S45).

Because of the above operation, inherent bad blocks that were determined as failed blocks during the die sorting are retained in the unselected state because of the setting of flags BBF_L and BBF_R having been completed.

FIGS. 10A and 10B show an example of a process for an acquired bad block occurred after a shipment.

In a state where a write or erase operation has been performed by a user and the writing or erasing has failed, the logical block failed its writing or erasing needs to be managed as an acquired bad block.

That is, as shown in FIG. 10A, it is determined upon the writing or erasing whether the writing or erasing has failed or not (S51). As a result, in the case where the writing or erasing failed, the address of the logical block failed the writing or erasing is retained, for example, in a RAM of the memory controller 20 as acquired bad block information. The controller 20 registers this address in a managed region 11b in the memory cell array 11 (S52). This managed region is generated, for example, in a block address 0 or 1023 of the memory cell array 11.

FIG. 10B shows the initialization operation upon using the non-volatile semiconductor memory device. When the power is turned on, the power-on reset process is performed, and the chip ready state is set (S61). In this state, the acquired bad block addresses stored in the managed region 11b of the memory array 11 are read, and are registered, for example, in the RAM in the memory controller 20 (S62). The addresses registered in this RAM are controlled by the memory controller 20 so as not to be accessed.

Further, in the case where the writing failure or the erasing failure newly occurs, that logical block is determined as a bad block. In this case, the information in the managed region 11b is read, and the information of the bad block that has newly occurred is added to the managed region 11b (S63). Thereafter, writing is performed on remaining logical blocks other than the bad blocks (S64).

The new bad block address registered in the managed region 11b is transferred to the RAM of the controller 20 after the subsequent power-on reset process, and is managed so as not to be accessed thereafter.

As aforementioned, the inherent bad blocks hinders the testing upon the die sorting test. Therefore, it is essential to set flags BBF_L and BBF_R in the latch circuits 31a, 31b, and cause the bad blocks to be unselected upon the die sorting test.

Further, flags BBF_L and BBF_R are set in the latch circuits 31a, 31b for every power-on reset processes even after the shipment. However, originally when the memory controller 20 can control such that the bad blocks are not accessed, there is no need to set flags BBF_L and BBF_R in the latch circuits 31a, 31b. Further, the acquired bad blocks are simply controlled by the memory controller 20 so as not to be accessed, and there is no need to set flags BBF_L and BBF_R in the latch circuits 31a, 31b.

Effects of the Present Embodiment

According to the present embodiment, the plurality of word lines configuring the U-shaped NAND string is divided into two logical blocks according to the extracting direction of the word lines, and the latch circuits 31a, 31b configured to store the bad block flag (BBF_L and BBF_R) corresponding to the respective logical block are provided. Therefore, flags BBF_L and BBF_R are set in the latch circuits 31a, 31b corresponding to the bad block. Accordingly, for example, even when the physical block on the In side has failed, there are cases in which the physical block on the Out side can be accessed. As a result, it becomes possible to suppress the capacity that becomes incapable of using to ½ of a conventional technique. In the BiCS flash memories using stacked-type memory cells, a minimum unit of the failed block can be made small. As a result, a failure-relief efficiency upon when the failure has occurred can be improved. Because of this, a necessary number of extension blocks can be reduced, and a reduction in a chip area can be expected.

Further, the information on the inherent bad blocks detected in the die sorting test are registered in the ROM fuse region 11a of the memory cell array 11, and are set in the latch circuits 31a, 31b corresponding to the bad blocks after the power-on reset process. Further, the information on the acquired bad block occurred after the shipment is registered in the managed region 11b of the memory cell array 11b, and after the power-on reset process, the bad block is controlled to be unselected based on the bad block address registered in the managed region 11b by the controller 20. Accordingly, the bad blocks can be controlled so as not to be accessed with respect to the inherent failure and the acquired failure.

Second Embodiment

Figure 11:
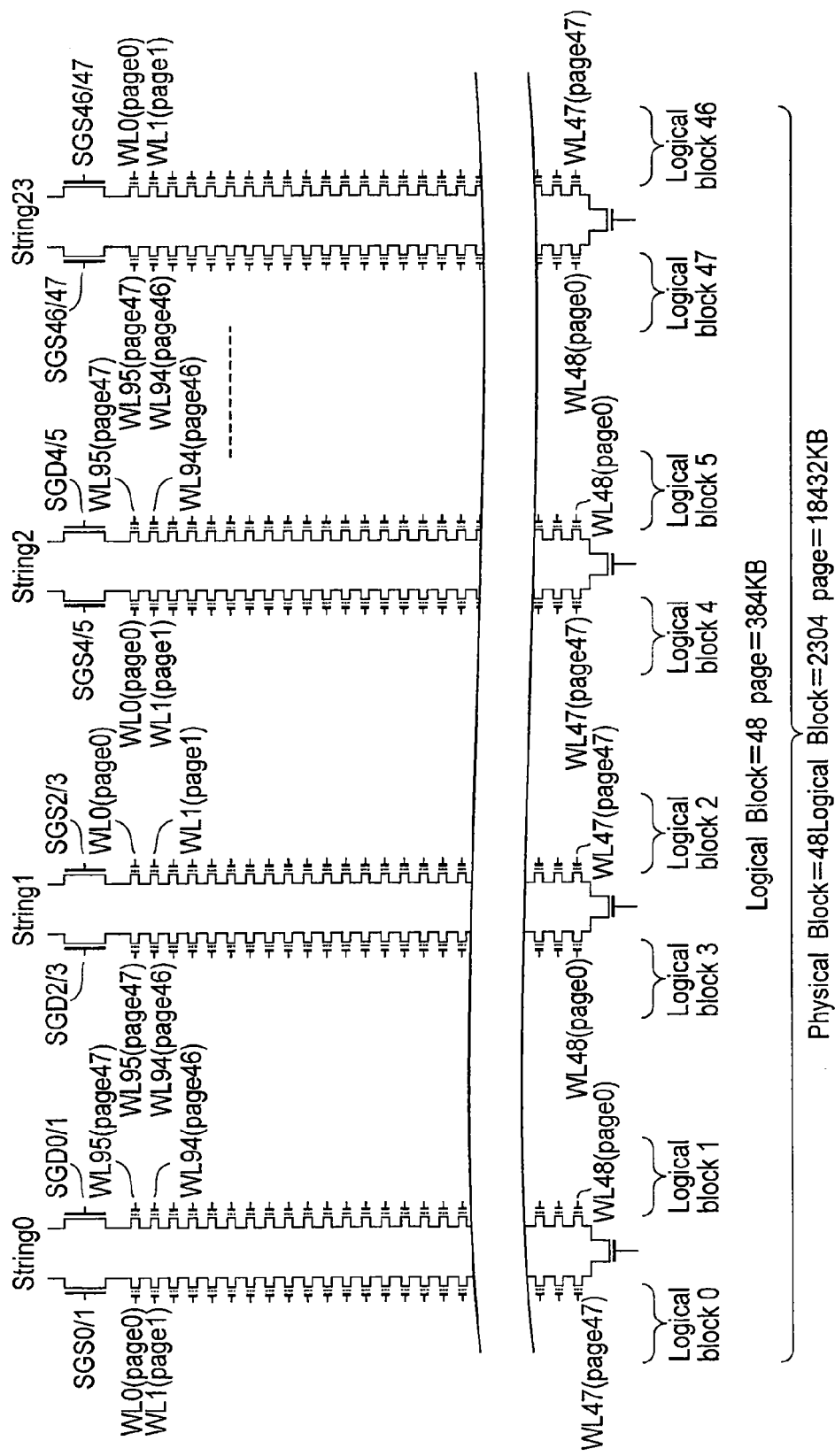
FIG. 11 is a diagram showing a block configuration of a p-BiCS memory in a non-volatile semiconductor memory device of a second embodiment.

FIG. 11 shows a configuration of a memory cell array in a second embodiment. For the purpose of convenience of illustration, FIG. 11 shows only a configuration of a plurality of U-shaped strings connected to one bit line in one physical block.

As shown in FIG. 11, the second embodiment uses a physical block as a unit to share the word lines WL, and half strings are respectively referred to as logical blocks (second logical blocks). For example, word lines WL0 to WL47 of the string 0 is determined as the second logical block 0, and word lines WL48 to WL95 are determined as the second logical block 1. When the second logical block 0 or the second logical block 1 in the string 0 is selected, SGS0/1 is set to be in the selected state. Further, word lines WL0 to WL47 of the string 1 is determined as the second logical block 2, and word lines WL48 to WL95 are determined as the second logical block 3. Similarly, word lines WL0 to WL47 of the string 23 is determined as the second logical block 46, and word lines WL48 to WL95 are determined as the second logical block 47.

By providing the row decoder as shown in FIG. 6, when a writing failure occurs, for example, because of a short circuit of the word lines WL in one page in the first logical block 0, the first logical block 0 having word lines WL0 to WL47 is determined as the bad block. By configuring as above, in regards to the inherent failure, it becomes possible to suppress the capacity that becomes incapable of using to ½ of the conventional technique.

Further, in regards to the acquired failure, a failure table storing information on the bad blocks is generated in the RAM of the memory controller 20 in a unit of the second logical block. Because of this, it becomes possible to unselect in a unit of the half string.

In the example shown in FIG. 11, for example, when a writing failure occurs in one page in the second logical block 0, only the second logical block 0 is determined as a bad block. Because of this, it becomes possible to suppress the capacity that becomes incapable of using to ¼8 of the conventional technique, which is 384 KB.

Accordingly in the second embodiment, it becomes possible to suppress the capacity that becomes incapable of using by the occurrence of a bad block to a level of the planar NAND flash memory.

Further, the relief of the acquired failure can be adapted to the block configuration as shown in FIG. 4.

As shown in FIG. 4, an explanation will be given of a p-BiCS having 48 layers of word lines WL, i.e. having 96 word lines and 24 strings per one block. Further, the number of blocks will be 1024. That is, 1024 instances of the block shown in FIG. 5 are assumed as being provided. Further, one memory cell stores 2 bits of data. The 2 bits are distinguished by a lower page (lower page) address and an upper page (upper page) address.

In this case, 10 bits are necessary for expressing a block address, and 5 bits are necessary for expressing a string address. Further, if a half string address is to be expressed, 6 bits will be required.

Originally, despite the existence of a cell to which a few bits writing cannot be performed, such will not be a problem because a relief therefor is possible by ECC. However, this time, for the sake of simplifying the explanation, it is assumed that the writing fails if there is even a bit to which the writing cannot be performed for 1 bit, and a failed page occurs thereby. The examples of the failed page and measures against the failure thereof will be listed as (1) to (3).

(1) Assume that a writing failure has occurred during a programming of a lower page of a word line WL5 in a string 9 of a block 204. A cause thereof is the writing becoming disabled because one of the cells in this page has physically failed while experiencing repetitions of the writing/erasing and high voltage stress. The failure caused by this memory cell fails the writing of the lower page/upper page selected by word line WL5 of the string 9 including this cell, however, for example, a word line WL5 of a string 10 can be written with no problem. In this case, an address of the string 9 of the block 204 is registered in the managed region 11b.

(2) Assume that a writing failure has occurred during a programming of a lower page of a word line WL6 in a string 0 of a block 435. A cause thereof is the writing becoming disabled because word lines WL6 and WL7 have short circuited during use despite having passed the die sorting test. In the failure caused by this driving on the In/Out side, since word lines WL6 and WL7 are short circuited, all of the pages belonging to the word lines in all of the strings (string 0 to string 23) in the block 435 become incapable of being written. In this case, addresses of the string 0 to the string 23 in the block 435 are registered in the managed region 11b.

(3) Assume that a writing failure has occurred during a programming of a lower page of a word line WL0 in a string 3 of a block 687. A cause thereof is a polysilicon having been abruptly cut off because of a void in a polysilicon column embedded in the U-shaped string of the cells in this page. In this failure, all of the pages belonging to the string 3 are failed. The writing of other strings, for example, pages belonging to a string 4 has no problem. In this case, address of the string 3 of the block 687 is registered in the managed region 11b.

The memory controller 20 reads data in the managed region 11b after the completion of the power-on reset process, and transfers to the RAM of the memory controller 20. Thereafter, it is controlled such that the addresses registered in the RAM are not accessed.

According to the above second embodiment, the physical block that is determined by a physical restriction such as an erasing unit can be divided into logical blocks, and it can be dealt as a bad block for each of the logical blocks. Because of this, when a writing failure, etc. occurs, it becomes possible to reduce the area that becomes incapable of being used because of the bad block. Accordingly, the necessary number of extension blocks can be reduced, and the chip area can be reduced.

In the case of the p-BiCS memory, instead of configuring the strings sharing the word lines as one block (which is a unit of replacement upon the occurrence of the failure), by configuring a string unit, or a half-string unit of a p-BiCS memory, i.e. between SGD-pipe and pipe-SGS with different logical blocks, the minimum unit of the failed block can be made small, and the relief efficiency upon the occurrence of the failure can dramatically be improved.

That is, in regards to the acquired failure, the logical blocks can freely be set; for example, as aforementioned, the half string shown in FIG. 11 can be determined as the second logical block, and a management under a word line unit as the minimum unit is also possible. Further, for example, with 4 word lines, etc., a plurality of word lines may be grouped as a logical block, and be managed thereby.

Third Embodiment

FIG. 12 shows a third embodiment, and is a diagram showing a circuit configuration of a row decoder.

The third embodiment shows an example of adapting the circuit shown in FIG. 6 to a planar NAND flash memory. The configuration of the row decoder itself is substantially identical to FIG. 6, and a typical NAND flash memory is used as the memory. That is, in the first and second embodiments, the plurality of memory cells configuring the NAND string was arranged in the vertical direction relative to the surface of the semiconductor substrate. Contrary to this, in the third embodiment, a plurality of memory cells configuring a NAND string is arranged along a surface of a semiconductor substrate, and word lines WL0 to WL127 are separated into two groups of word lines WL0 to WL63 and word lines WL64 to WL127, as is similar to the first and second embodiments.

In the case of the third embodiment, SEL_L is a signal that is high when word lines WL0 to WL63 are selected, and SEL_R is a signal that is high when word lines WL64 to WL127 are selected. For example, when word lines WL0 and WL1 were short circuited, flag BBF_L (high) is set in a latch circuit 31a of this logical block. By configuring as above, for example, when one of word lines WL0 to WL63 is selected in the writing operation, this logical block is brought to the unselected state. Accordingly, word lines WL0 and WL1 being short circuited does not impose any undesirable influence on other components. On the other hand, when word lines WL64 to WL127 in this logical block are selected, this logical block is brought to the selected state.

At this occasion, $V_{PGM}$ is applied to the selected word lines among word lines WL64 to WL127, and voltage corresponding to a boost option such as VISO/VGP is transferred to the word lines in the periphery of the selected word lines. On the other hand, Vpass is transferred to all of word lines WL0 to WL63. Because of this, word lines WL0 and WL1 being short circuited will not be a problem.

That is, even if a short circuit exists between adjacent word lines, word lines arranged at positions apart from this short circuited portion has high possibility of being used with no problem. For example, in a case where word lines WL5 and WL6 are short circuited, word lines WL64 to WL127 can be used without failing them.

According to the third embodiment, in a NAND string configured of a plurality of memory cells being serially connected, even when a short circuit of word lines is occurring, an entirety of the NAND string does not have to be failed, and a half of the NAND string can be used. That is, although a plurality of NAND strings exist in a physical block, a half of the respective NAND strings can be used. Accordingly, it becomes possible to suppress a frequency of occurrence of bad blocks.

(Variants)

Note that the present innovation is not limited to the respective embodiments as aforementioned. The configuration of the memory cell array is not necessarily limited to the p-BiCS, and it may be adapted to a stacked memory device in which memory cells are stacked on a semiconductor substrate. Further, the structure of the p-BiCS is not limited by any means to FIG. 1, and a modification may appropriately be made according to a technical specification. Moreover, the configuration of the row decoder is not limited by any means to FIG. 6 or FIG. 12, and a modification may appropriately be made according to the technical specification.

Fourth Embodiment

Figure 13:
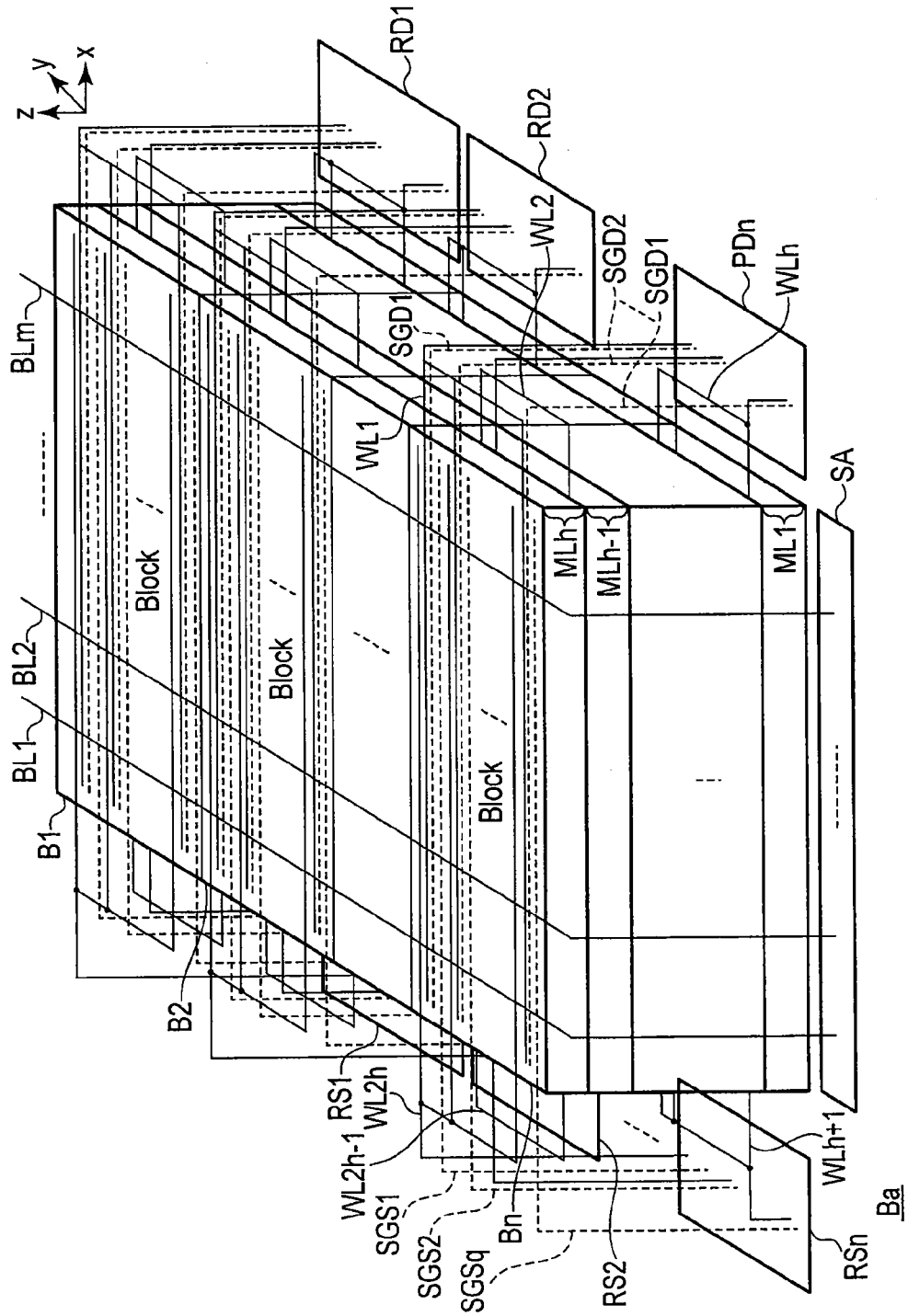
FIG. 13 is a perspective view schematically showing a memory cell array to which a fourth embodiment is applied.
Figure 14:
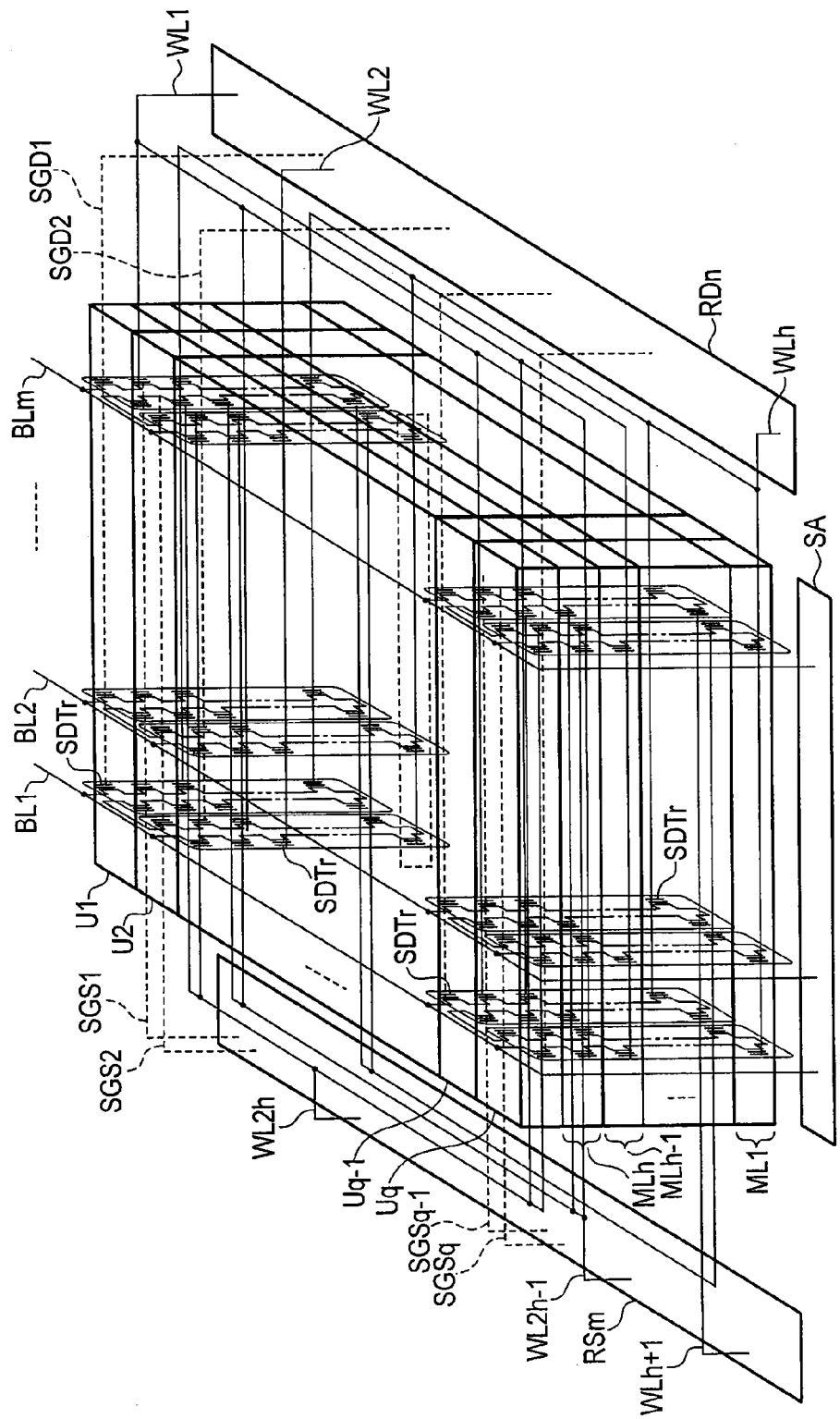
FIG. 14 is a perspective view schematically showing one block Bn shown in FIG. 13 and a circuit in its periphery.
Figure 15:
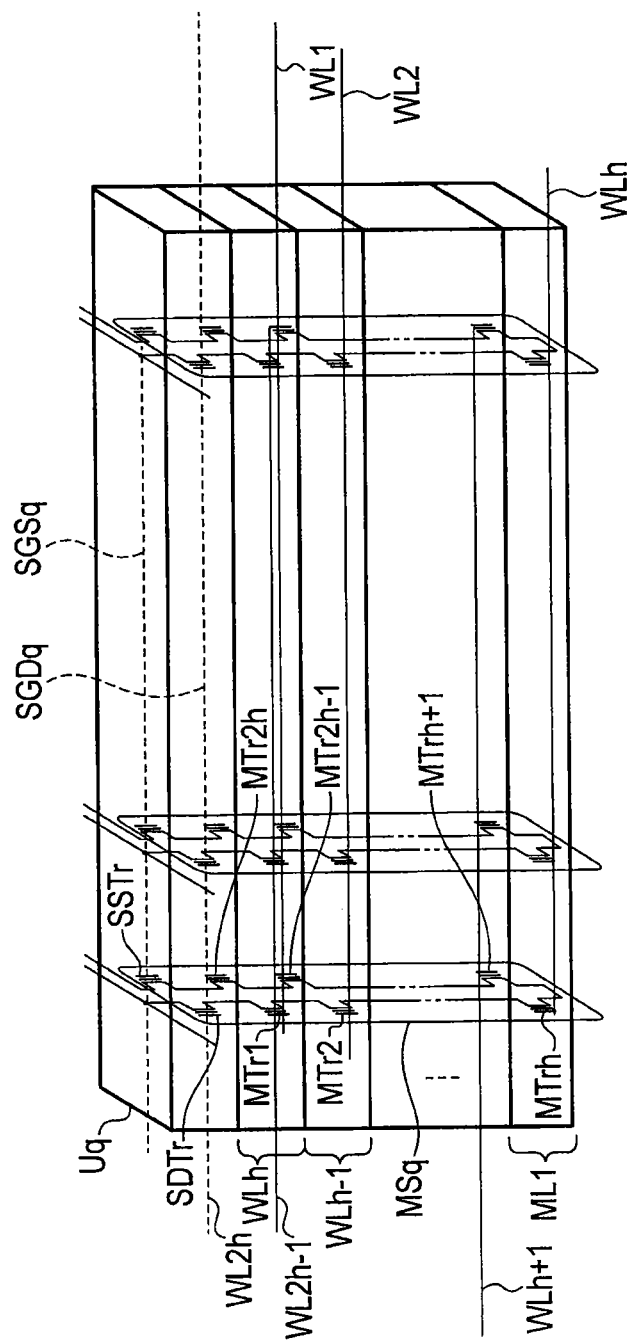
FIG. 15 is a perspective view schematically showing a configuration of one string unit shown in FIG. 14.

FIG. 13, FIG. 14, and FIG. 15 schematically show a memory cell array to which a fourth embodiment is applied. In FIG. 13, FIG. 14, and FIG. 15, same reference signs are given to same components.

The respective embodiments described above manage the bad block using the flag. In contrast, the fourth embodiment manages the bad block without using a flag.

FIG. 13 schematically shows one plane in a chip. The chip can include a plurality of planes having the same configuration. The present embodiment uses a non-volatile semiconductor memory device in which, for example, two planes are mounted in one chip as a premise. However, in the following explanation, only one plane will be explained for the convenience of explanation.

In FIG. 13, one plane includes a plurality of physical blocks (hereinafter, simply called blocks) B1, B2 to Bn disposed on a semiconductor substrate Ba. The plurality of blocks B1, B2 to Bn are disposed in an arrow y direction shown in the figure on a surface of the semiconductor substrate Ba.

Each block includes a plurality of memory layers ML1 to MLh−1, MLh stacked above the semiconductor substrate Ba. That is, the plurality of memory layers ML1 to MLh−1, MLh is disposed in a direction vertical to the surface of the semiconductor substrate Ba, i.e., in an arrow z direction shown in the figure.

As described later, the memory layers ML1 to MLh−1, MLh have pairs of word lines WLh, WLh+1 to WL2, WL2h−1, WL1, WL2h. The word lines WLh, WLh+1 to WL2, WL2h−1, WL1, WL2h are disposed in a direction orthogonal to the direction in which the plurality of blocks B1, B2 to Bn is disposed, i.e., in an arrow x direction shown in the figure.

Further, the memory layer MLh of the uppermost portion of each block includes pairs of selection gate lines SGD1, SGS1, SGD2, SGS2 to SGDq, SGSq. The selection gate lines SGD1, SGS1, SGD2, SGS2 to SGDq, SGSq are disposed in the same direction (x direction shown in the figure) as that of the respective word lines.

In the semiconductor substrate Ba, row decoders RD1, RD2 to RDn, RS1, RS2 to RSn are disposed in the direction in which the plurality of blocks B1, B2 to Bn are disposed corresponding to the respective blocks. That is, the row decoders RD1, RD2 to RDn, RS1, RS2 to RSn are disposed in the arrow y direction shown in the figure.

The word line WLh to WL2, WL1 and the selection gate lines SGD1, SGD2 to SGDq of the respective memory layers ML1 to MLh−1, MLh are connected to the row decoders RD1, RD2 to RDn, and the word lines WLh+1 to WL2h−1, WL2h and the selection gate lines SGS1, SGS2 to SGSq are connected to the row decoders RS1, RS2 to RSn.

Further, a plurality of bit lines BL1, BL2 to BLm is disposed on the respective blocks in a direction orthogonal to the plurality of word lines (arrow y direction shown in the figure).

Further, in the semiconductor substrate Ba, a sense amplifier unit SA is disposed at an end in the direction in which the plurality of blocks is disposed. The plurality of bit lines BL1, BL2 to BLm is connected to the sense amplifier unit SA.

FIG. 14 schematically shows the block Bn shown in FIG. 13 and a circuit in its periphery. The block Bn includes a plurality of string units U1, U2 to Uq−1, Uq. The string units U1, U2 to Uq−1, Uq are disposed in the direction of the bit lines BL1, BL2 to BLm (arrow y direction shown in the figure). The respective string units U1, U2 to Uq−1, Uq include a plurality of NAND strings MS1, MS2 to MSm. The NAND strings MS1, MS2 to MSm are disposed corresponding to the bit lines BL1, BL2 to BLm, respectively. The respective NAND strings have a configuration shown in FIG. 2 and are connected to corresponding bit lines via drain side selection transistors SDTr included in the respective NAND strings.

Note that, in FIG. 2, although each of the NAND strings includes eight memory cells, in the present embodiment, each NAND string includes h pieces of memory cells.

FIG. 15 shows a configuration of one string unit shown in FIG. 14. As described above, the string unit has the plurality of NAND strings. In each NAND string, each of the memory layers MLh to ML1 is disposed with a pair of memory cells located adjacent with each other in a bit line direction. Gate electrodes of memory cells MTr1 to MTrh, MTrh+1 to MTr2h disposed to the respective memory layers MLh to ML1 are connected to the word line WL1 to WLh, WLh+1 to WL2h, respectively.

In the fourth embodiment, the string unit Uq shown in FIG. 15 is defined as a logical block. That is, in the fourth embodiment, the logical block is a part of group of the NAND strings that share the word lines. The logical block includes a first logical block and a second logical block. A group (one string unit) of the memory cells connected to the word lines WL1 to WLh, WLh+1 to WL2h is called the first logical block as described above, and a group (half string unit) of the memory cells connected to a half number of the word lines WL1 to WLh or the word line WLh+1 to WL2h is called the second logical block as described above. The fourth embodiment manages a failed logical block every one string unit or every half string unit.

As a method of managing a specific failed logical block, two failed logical block registration methods described below are available.

(1) A method of providing a row decoder with q pieces of latch circuits and registering a failed logical block using the latch circuits; and (2) A method of registering a failed logical block to selection transistors SSTr, SDTr of all the strings of string units.

First, the method of registering the failed logical block shown in (1) described above will be explained.

The row decoder of the embodiment will be explained using FIG. 24 and FIG. 25.

Figure 24:
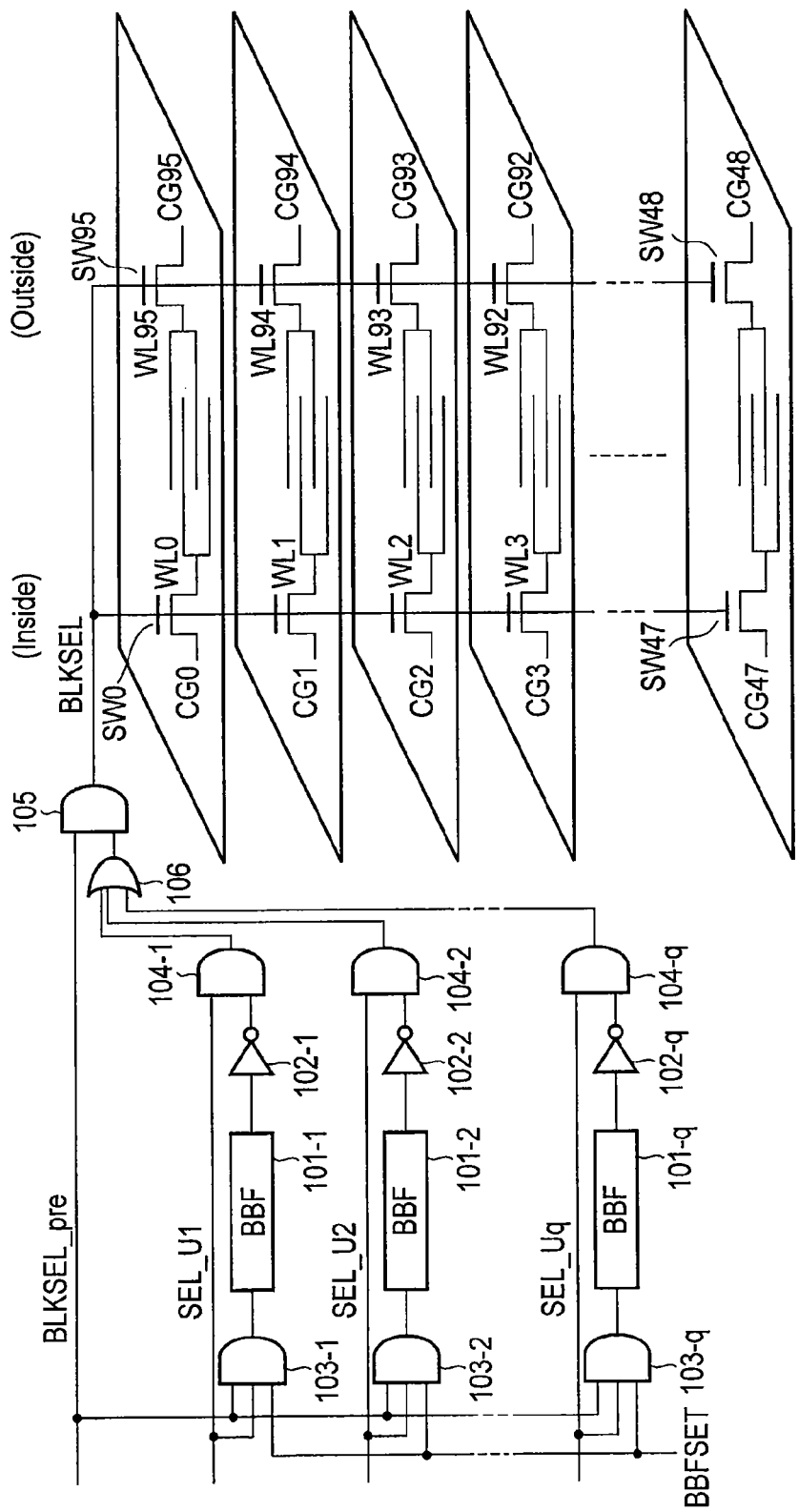
FIG. 24 is a view showing an example of a row decoder applied to a fourth embodiment.
Figure 25:
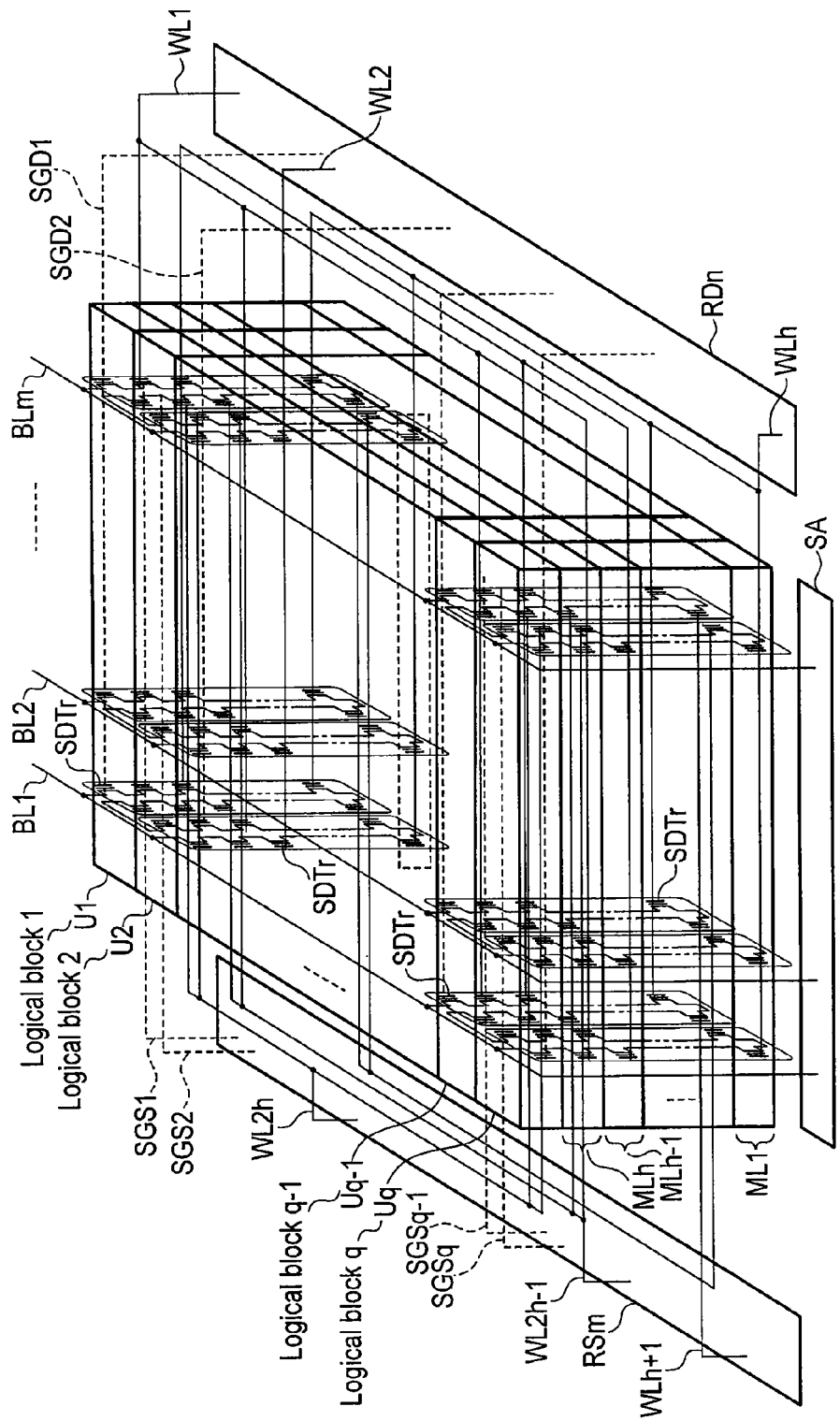
FIG. 25 is a view showing an example of a logical block applied to the fourth embodiment.

FIG. 24 shows an example of a block decode included in a row decoder of a seventh embodiment.

As shown in FIG. 24, the block decoder is configured of latch circuits 101-1 to 101-q, inverters 102-1 to 102-q, AND gates 103-1 to 103-q, 104-1 to 104-q, 105, and OR gates 106 as many as the string units.

A signal SEL_U1 and a signal BBFSET for selecting a block selection signal BLKSEL_pre and a string unit U1 are input to an input terminal of the AND gate 103-1, and an output terminal of the AND gate 103-1 is connected to the latch circuit 101-1. A signal SEL_U2 and the signal BBFSET for selecting the block selection signal BLKSEL_pre and a string unit U2 are input to an input terminal of the AND gate 103-2, and an output terminal of the AND gate 103-1 is connected to the latch circuit 101-2. A signal SEL_Uq and the signal BBFSET for selecting the block selection signal BLKSEL_pre and a string unit Uq are input to an input terminal of the AND gate 103-q, and an output terminal of the AND gate 103-q is connected to the latch circuit 101-2. When the string units U1 to Uq are selected, the signals SEL_U1 to SEL_Uq for selecting the string units U1 to Uq become a H-level, respectively, and when the string units U1 to Uq are unselected, the signals SEL_U1 to SEL_Uq become an L-level.

An output signal of the latch circuit 101-1 is supplied to an input terminal of the AND gate 104-1 via the inverter 102-1. The signal SEL_U1 is supplied to the other input terminal of the AND gate 104-1. An output signal of the latch circuit 101-2 is supplied to an input terminal of the AND gate 104-2 via the inverter 102-2. The signal SEL_U2 is supplied to the other input terminal of the AND gate 104-2. An output signal of the latch circuit 101-q is supplied to an input terminal of the AND gate 104-q via the inverter 102-q. The signal SEL_Uq is supplied to the other input terminal of the AND gate 104-q.

Output signals of the AND gates 104-1 to 104-q are supplied to an input terminal of the OR gate 106, and an output signal of the OR gate 106 is supplied to an input terminal of the AND gate 105. The block selection signal BLKSEL_pre is input to the other input terminal of the AND gate 105. An output signal of the AND gate 105 is output as a block selection signal BLKSEL. The AND gates 104-1 to 104-q, the AND gate 105, and the OR gate 106 configure, for example, a drive circuit of word lines.

When the string units U1 to Uq corresponding to the latch circuits 101-1 to 101-q are failed, the latch circuits 101-1 to 101-q hold flags BBF_U1 to BBF_Uq which show a failure, respectively. That is, as shown in FIG. 25, the string units U1 to Uq configure one logical blocks 1 to q, respectively. Accordingly, one physical block has q pieces of physical blocks.

The flags BBF_U1 to BBF_Uq which show the failure are set in the latch circuits 101-1 to 101-q in for example, a power-on reset process when power has been turned on.

A failed physical block address is stored in a ROM fuse region 11a of a memory cell array 11. The failed physical block address stored in the ROM fuse region 11a is read in the power-on reset process to be described later. The latch circuits 101-1 to 101-q are set based on the address.

Further, as will be described later, the flags which show the failure and a logical block address which is a treatment unit of failed blocks are held in the ROM fuse region 11a by being caused to correspond to each other based on a result of, for example, a die sorting test.

In a memory cell array having a block configuration shown in FIG. 24, word lines WL0 to WL47 drawn out to a side (Inside) are connected to control signal lines CG0 to CG47 via switching transistors, respectively.

Further, word lines WL48 to WL95 drawn out to the other side (Outside) are connected to control signal lines CG48 to CG95 via switching transistors, respectively. Respective gates of the transistors SW0 to SW95 are commonly connected to an output terminal of the AND gate 105.

According to the embodiment, the latch circuits 101-1 to 101-q are arranged to store the bad block flags (BBF_U1, BBF_U2, . . . BBF_Uq) corresponding to the respective string units including a plurality of U-shaped NAND strings. Accordingly, the bad block flags BBF_U1 to BBF_Uq corresponding to the latch circuits 101-1 to 101-q are set corresponding to bad blocks, respectively.

For example, the string unit U1 includes a failure and the bad block flag BBF_U1 is set in the latch circuit 101-1. At the time, when the string unit U1 of the physical blocks is selected, the physical blocks are not entirely selected (signal BLKSEL is at an L-level). On the other hand, although a string unit (for example, the string unit U2) other than the string unit U1 is selected and the string unit U1 is not selected, a physical block including the string unit U1 is selected (signal BLKSEL is at a H-level). Accordingly, even if the string unit U1 includes the failure, the string unit U2 to the string unit Uq of the same physical blocks may be accessed. As a result, a capacity which becomes unusable can be suppressed to 1/q of a conventional capacity.

In a BiCS flash memory using a stacked type memory cell, a minimum unit of an unusable region can be reduced. As a result, when a failure occurs, a relief efficiency can be improved. The improvement makes it possible to expect that a number of necessary expansion blocks can be reduced and a chip area can be also reduced.

Further, the information on failed logical blocks such as inherent failed string units detected in the die sorting test is registered in the ROM fuse region 11a of the memory cell array 11 and is set in the latch circuits 101-1 to 101-q corresponding to the bad blocks after the power-on reset process. Further, the information on an acquired bad block occurred after shipment is registered in a managed region 11b of the memory cell array 11b, and after the power-on reset process, the bad block is controlled so as to be unselected based on the bad block address registered in the managed region 11b by a controller 20.

Accordingly, the bad blocks can be controlled so as not to be accessed with respect to the inherent failure and the acquired failure.

According to the embodiment, even when a word line is short-circuited in the NAND string configured of a plurality of memory cells being serially connected, the NAND string is not treated as a failed NAND string in its entirety and is managed in a string unit so that a string unit that is not short-circuited can be used. Accordingly, it is possible to suppress the frequency of occurrence of the bad blocks.

Next, the method of registering the failed logical block of (2) will be explained.

One physical block of the embodiment has a plurality of string units U1 to Uq. The method will be explained below assuming a case that the string unit U1 is failed.

In the case, "C" data is stored in selection transistors SSTr, SDTr of all the strings included in the string unit U1 for example. The data of the selection transistors SSTr, SDTr is not necessarily limited to "C" data, and it may be adapted to for example "A" or "B" data. The string unit U1 is unselected at all times by turning off the selection transistors SSTr, SDTr at all times.

A detail method of the above (2) may be disclosed in U.S. patent application Ser. No. 13/782,847. U.S. patent application Ser. No. 13/782,847, the entire contents of which are incorporated by reference herein.

(When Failed Logical Block is Registered to ROM Fuse Region)

FIG. 16 shows an example of a format of the ROM fuse region 11a described above.

The ROM fuse region 11a is a region of, for example, one page and includes a registration region 1000 of column replacement information, a registration region 1100 of failed physical block information, a registration region 1200 of trimming information, a registration region 1300 of first failed logical block information, a registration region 1500 of second failed logical block information, and registration regions 1400, 1600 to which information other than the information described above is registered. These register regions are allocated corresponding to column addresses. At the time of manufacture, no information is registered to the registration regions 1000 to 1600.

When a failed column and a failed physical block are detected as a result of, for example, a die sorting test before shipment, the column replacement information and the failed physical block information are registered to the registration region 1000 and the registration region 1100. Further, the trimming information is registered to the registration region 1200.

The column replacement information is redundancy information for replacing a failed column with a spare column, and the failed physical block information is information for prohibiting an access as a bad block.

Figure 17:
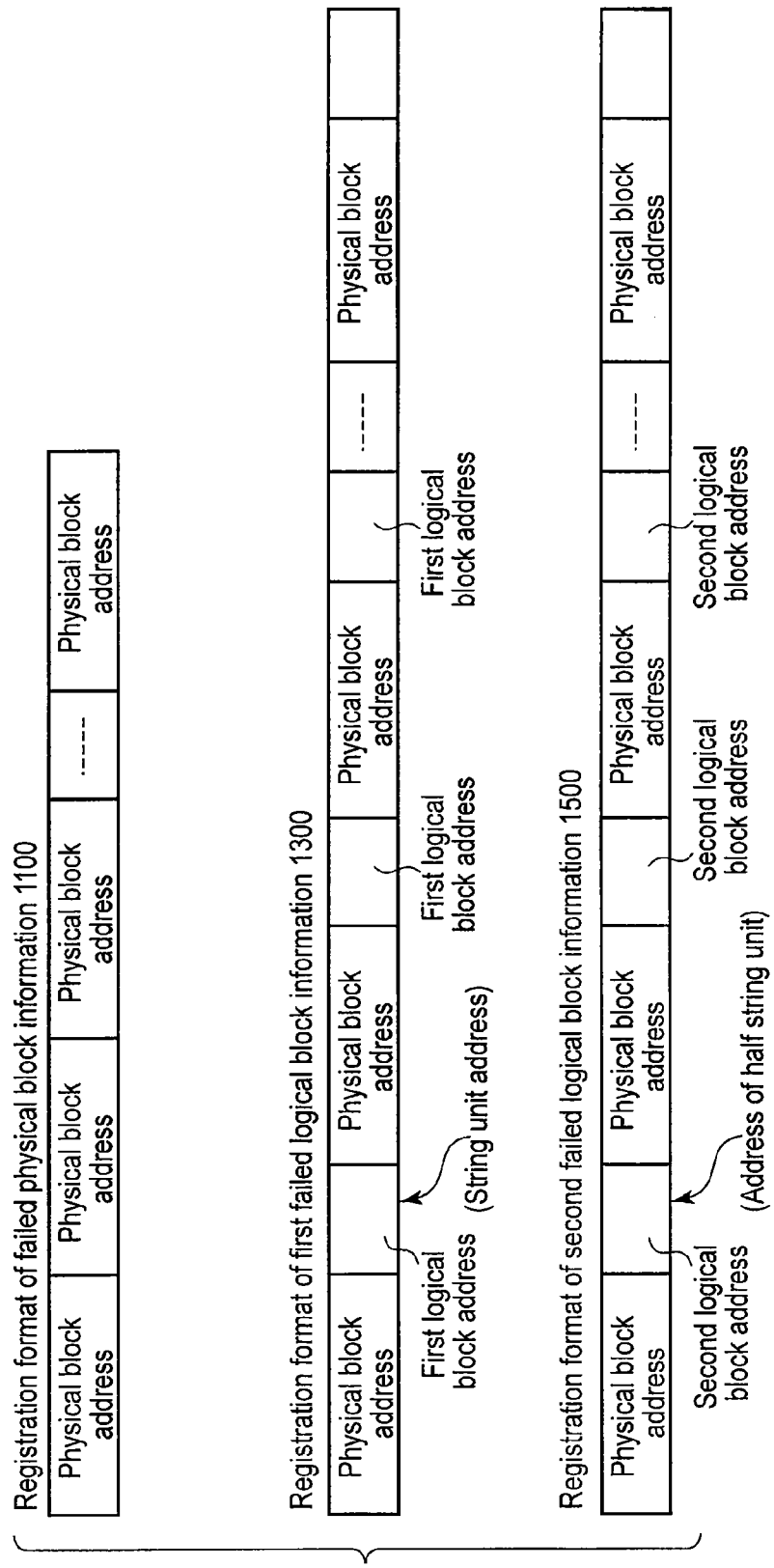
FIG. 17 is a view showing an example of the information shown in FIG. 16.

FIG. 17 shows examples of registration formats of the registration region 1100 of the failed physical block information, the registration region 1300 of the first failed logical block information, and the registration region 1500 of the second failed logical block information shown in FIG. 16.

As the result of the die sorting test, when the failed physical block, the first failed logical block, and the second failed logical block are detected, these information is registered to the registration regions 1100, 1300, 1500, respectively.

The failed physical block information includes a failed physical block address.

The first failed logical block information is includes a logical block address of a string unit having a failure (first logical block address) and a physical block address corresponding to the logical block address.

Further, the second failed logical block information includes a logical block address of a half string unit having a failure (second logical block address) and a physical block address corresponding to the logical block address.

(Position of ROM Fuse Region)

Figure 18:
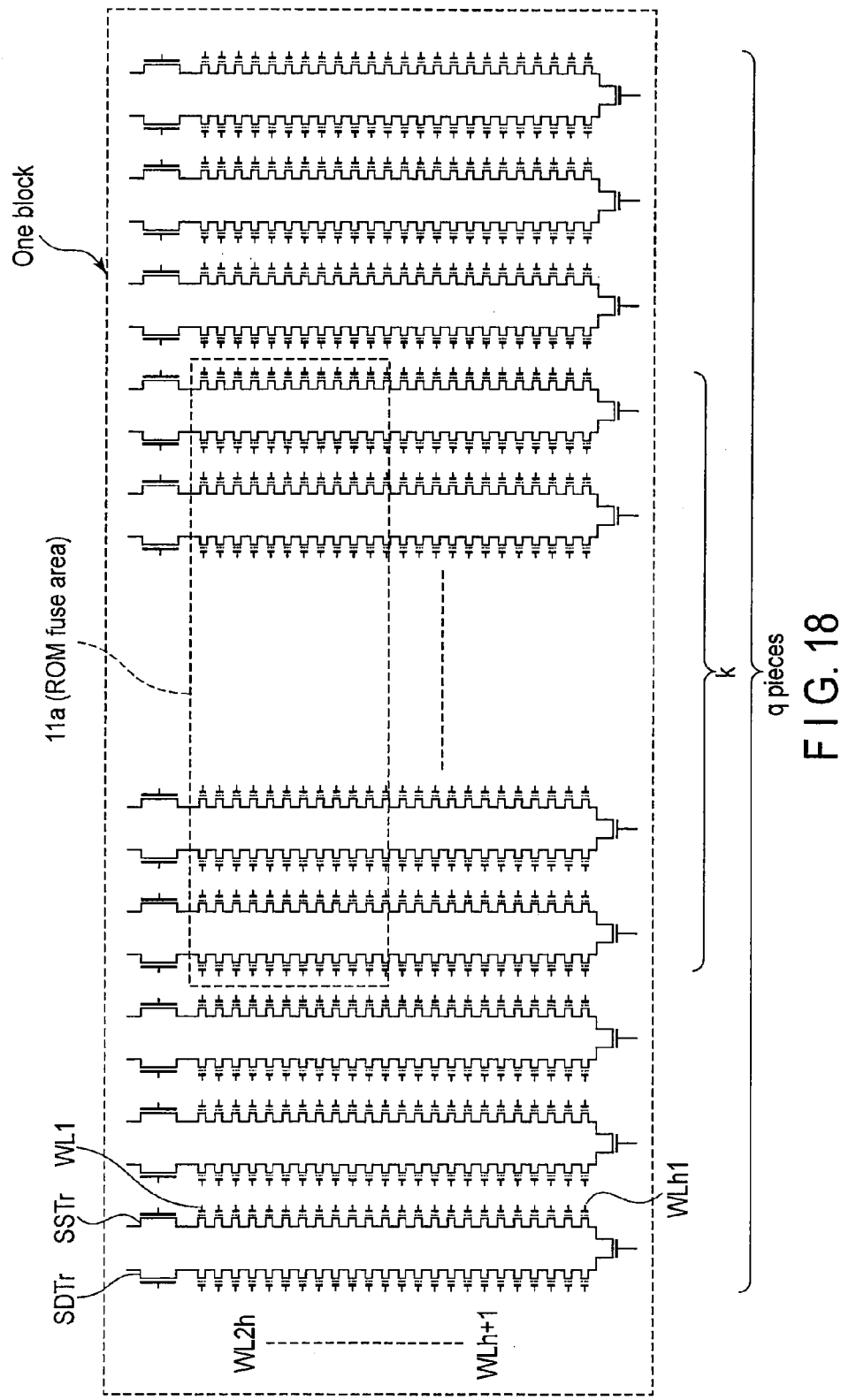
FIG. 18 is a view showing a position at which the ROM fuse region is disposed.

FIG. 18 schematically shows one block shown in FIG. 14. A position at which the ROM fuse region 11a is disposed will be explained using FIG. 18.

It is necessary to certainly hold the information recorded to the ROM fuse region 11a. Accordingly, it is preferable to dispose the ROM fuse region 11a at a position at which, for example, an electric field concentration is unlikely to occur as well as a data retention margin is large in a memory cell array 11.

Thus, the ROM fuse region 11a is disposed at a position described below in one block. That is, the ROM fuse region 11a is disposed to a region of one page selected by one of the half word lines of the word lines WL1 to WLh, WL2h to WLh+1 on the selection transistors SSTr or SDTr side in k pieces (k<q) of memory string units positioned at an approximately central portion of q pieces of memory string units disposed in the bit line direction.

That is, the ROM fuse region 11a is disposed to a region of one page selected by one word line positioned between a central portion of the memory strings and the selection transistors SSTr, SDTr in one string unit of the plurality of string units positioned to a central portion in the bit line direction in one block including the plurality of string units disposed in the bit line direction.

Specifically, when one block includes, for example, 12 memory string units and each memory string includes, for example, word lines WL0 to WL47, the ROM fuse region 11a is disposed to a region of one page selected by one word line of the word lines WL0 to WL23, WL24 to WL47 in, for example, fourth to eighth memory string units. That is, the ROM fuse region 11a is written to one word line of 576 word lines.

In the above configuration, when a power-on reset process is executed at the time, for example, power is applied, the first failed logical block information and the second failed logical block information registered to the registrations region 1300, 1500 of the ROM fuse 11a are read together the failed physical block information and the like registered to the registration region 1100 and transferred to a RAM of a memory controller 20. The memory controller 20 prohibits an access to a physical block and a string unit having a failure and a half string unit having a failure based on the failed physical block information and the first and second failed logical block information stored in the RAM.

According to the fourth embodiment, the ROM fuse region 11a has the registration region 1300 for registering first logical block information as the information of a string unit having a failure and the registration region 1500 for registering second logical block information as the information of a half string unit having a failure in addition to the registration region 1100 for registering the failed physical block information, and the information registered to the ROM fuse region 11a is read when power is applied and transferred to the memory controller 20. The memory controller 20 controls an access to a failed block based on the failed physical block information and the first and second logical block information. Accordingly, the memory controller 20 can easily control the failed block without using the flag.

Further, the ROM fuse region 11a is disposed to one page positioned between the central portion of the memory strings and the selection transistors SSTr, SDTr in the one string unit of the plurality of string units positioned to the central portion in the bit line direction in the one block including the plurality of string units disposed in the bit line direction. That is, the ROM fuse region 11a is disposed at the position at which the electric field concentration is unlikely to occur and which is resistant to read disturbance in the one block. Accordingly, the information recorded to the ROM fuse region 11a can be certainly held.

Moreover, since the ROM fuse region 11a is registered to one page, registered contents can be read by a read operation executed once. Accordingly, the power-on reset process can be executed at high speed.

Fifth Embodiment

Figure 19:
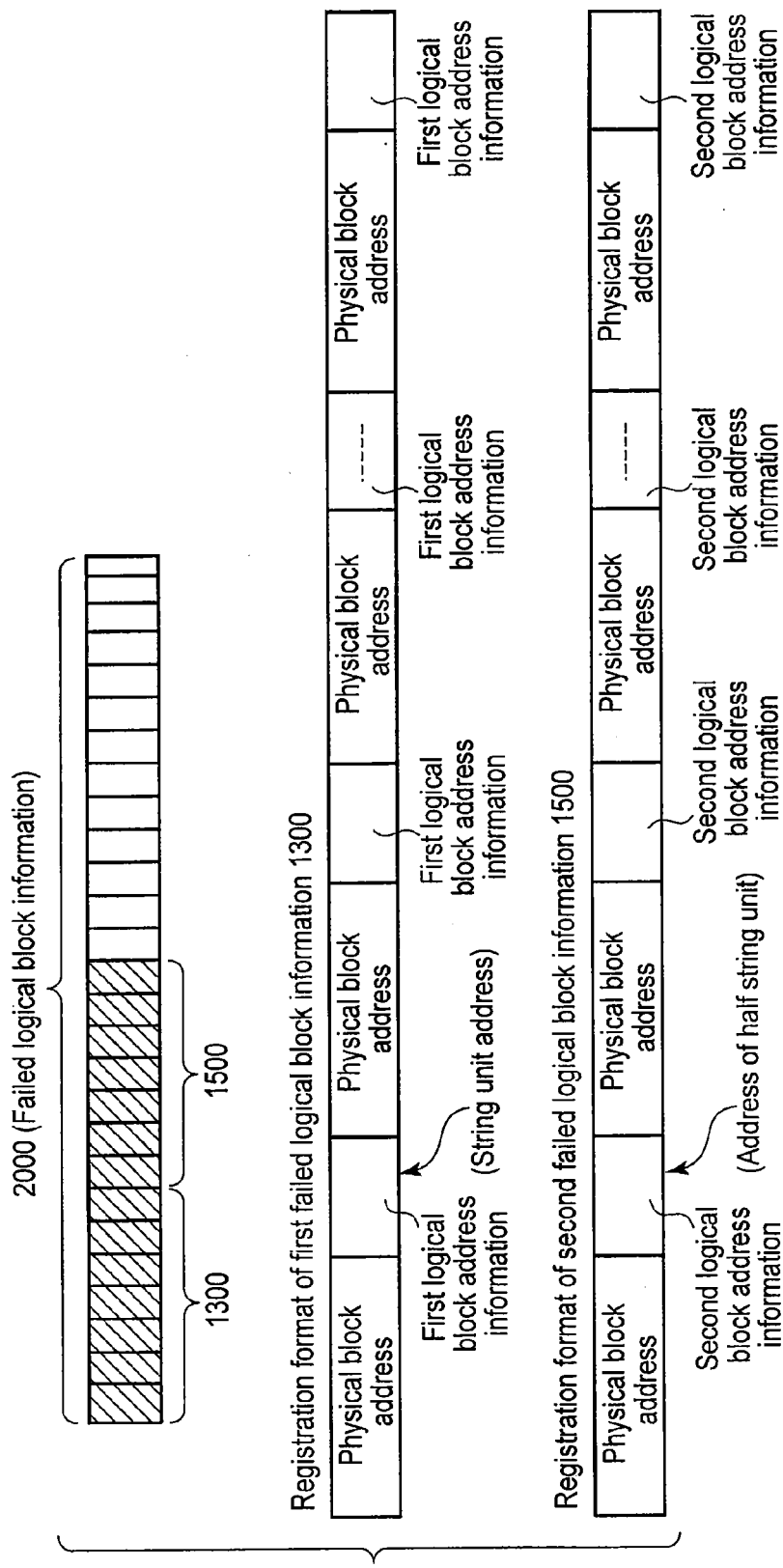
FIG. 19 shows a fifth embodiment and is a view showing an example of a format of information stored in a management region.

FIG. 19 shows a fifth embodiment. In FIG. 19, same reference signs are given to same components as those of the fourth embodiment.

In the fourth embodiment, the first and second failed logical block information is stored in the ROM fuse region 11a. The ROM fuse region 11a is a region to which a user cannot access, and the information stored in the ROM fuse region 11a is read and processed by the power-on reset process as described above.

That is, a failed block management using the bad block flag shown in the first to third embodiments and a failed block management which is shown in the fourth embodiment and does not use the flag prevent an occurrence of a serious failure in a chip unit when, for example, adjacent word lines are short-circuited and a write voltage is supplied to the short-circuited word lines. For the purpose, the failed physical block information is registered to the ROM fuse region 11a and the bad block flag is set at the time of power-on read so that the failed block is controlled so as not to be accessed.

In contrast, the fifth embodiment manages a slight degree of failure in which writing cannot be executed because, for example, a memory cell becomes abnormal although a serious failure in a chip unit does not occur.

That is, it is sufficient that first and second failed logical block information which is managed in the fifth embodiment can be placed in a knowable state by a controller in a power-on reset process without the need of a special set process. Accordingly, in the fifth embodiment, the failed logical block information is stored in a management region 11b in place of a ROM fuse region 11a.

FIG. 19 shows an example of failed logical block information 2000 according to the fifth embodiment. The failed logical block information 2000 includes first failed logical block information 1300 and second failed logical block information 1500 likewise the fourth embodiment. The failed logical block information 2000 is stored in the management region 11b. The management region 11b is a region which can be accessed by a user and can read the first and second failed logical block information 1300 and 1500 via a memory controller 20.

Specifically, the failed logical block information 2000 stored in the management region 11b is read by the memory controller 20 after a non-volatile semiconductor memory device has been started, and an access to the failed logical block is controlled based on the failed logical block information 2000.

Further, the failed logical block information 2000 is stored in the management region 11b to which the user can access. Accordingly, it is possible to register failed logical block which has been acquired to the failed logical block information 2000 although it is also possible to register the failed logical block information detected by, for example, a die sorting test.

That is, when a failure occurs in a write operation and a read operation to a memory cell array 11, the memory controller 20, for example, can register the logical address information of a string unit having a failure to the first failed logical block information 1300 and can record the logical address information of a half string unit having a failure to the second failed logical block information 1500.

In the manner described above, the failed logical block information which has been acquired can be managed using the management region 11b.

Note that, in the fifth embodiment, column replacement information, failed physical block information, and trimming information are stored in the ROM fuse region 11a likewise the fourth embodiment.

A portion of the management region 11b in which the failed logical block information 2000 is stored is not limited.

Further, in the fifth embodiment, the failed logical block information 2000 is recorded to the management region 11b and is not read at the time of power-on read. Further, it is not necessary to take the influence of electric field concentration to the failed logical block information 2000 recorded to the management region 11b into consideration different the information recorded to the ROM fuse region 11a, and it is sufficient that the failed logical block information 2000 can be read by the memory controller 20 and can be written to a RAM. Accordingly, it is not necessary to record the failed logical block information 2000 in one page, and when, for example, a format of a logical block is different from a configuration shown in FIG. 19, the failed logical block information 2000 can be also recorded by being divided to a plurality of pages.

(Logical Address and Physical Address Managed by Memory Controller 20)

As described above, the fourth and fifth embodiments use the multiplane including, for example, two planes in one chip as a premise.

It is assumed that a failure shown below occurs in, for example, a plane 0 and a plane 1.

As to the plane 0,
a block 3 and a block 10 are bad blocks,
a string unit 2 of a block 4 and a string unit 1 of a block 6 are failed string units.

As to the plane 1,
string units 0 and 1 of a block 5 a string unit 2 of a block 9 are failed string units.

FIGS. 20A and 20B show examples of conversion tables of a logical address and a physical address managed by the memory controller 20 (hereinafter, called a logical/physical conversion table) based on the failed status of the planes 0, 1. FIGS. 20A and 20B show parts of the logical/physical conversion tables 1, 2.

In the fourth and fifth embodiments, the memory controller 20 creates the logical/physical conversion tables 1 and 2 shown in FIG. 20A and FIG. 20B based on the failed physical block information, the first failed logical block information, and the second failed logical block information obtained from the ROM memory region 11a or the management region 11b.

The logical/physical conversion table 1 shown in FIG. 20A is a logical/physical conversion table of physical blocks and shows accessible blocks. The logical/physical conversion table 1 shows the physical addresses of accessible blocks of the plane 0 and the plane 1 corresponding to the respective logical addresses.

That is, in the plane 0 of FIG. 20A, since the block 3 and the block 10 are the bad blocks and the block 4 and the block 6 include the failed string units, these blocks are removed from the logical/physical conversion table 1 and managed so as not to be accessed.

Further, in the plane 1, since a block 7 is a bad block and the block 5 and the block 9 include the failed string units, these blocks are removed from the logical/physical conversion table 1 and managed so as not to be accessed.

The logical/physical conversion table 2 shown in FIG. 20B is a logical/physical conversion table of logical blocks and shows accessible string units. The logical/physical conversion table 2 shows physical addresses of accessible string units of the plane 0 and the plane 1 corresponding to respective logical addresses.

That is, in the plane 0 of FIG. 20B, since a string unit 2 (4_2) of a block 4 and a string unit 1 (6_1) of a block 6 are failed, these string units (4_1, 6_1) are removed from the logical/physical conversion table 2 and managed so as not to be accessed.

Further, in the plane 1, since string units 0, 1 (5_0, 5_1) of the block 5 and a string unit 2 (9_2) of a block 9 are failed, these string units (5_0, 5_1, 9_2) are removed from the logical/physical conversion table 2 and managed so as not to be accessed.

The memory controller 20 executes the multiplane control. That is, when, for example, a program of a logical address "3" or an access request for read is issued from a not shown host device, the memory controller 20 uses a physical address "5" of the plane 0 and a physical address "3" of the plane 1 corresponding to a logical address "3" of the logical/physical conversion table 1 shown in FIG. 20A as access targets and further uses a physical address "4_4" of the plane 0 and a physical address "5_5" of the plane 1 corresponding to a logical address "3" of the logical/physical conversion table 1 shown in FIG. 20B as access targets.

According to the fifth embodiment, the first and second failed logical blocks are stored in the management region 11b in place of the ROM fuse region 11a. Since the ROM fuse region 11a has a suppressed capacity, the ROM fuse region 11a can be effectively used by storing the first and second failed logical blocks in the management region 11b.

Since the first and second failed logical blocks are stored in the management region 11b, the first and second failed logical blocks can be easily read by the memory controller 20 and can be easily managed.

Further, according to the fifth embodiment, it is possible to easily manage a failed logical block, which has been acquired, by the memory controller 20.

Sixth Embodiment

Figure 22:
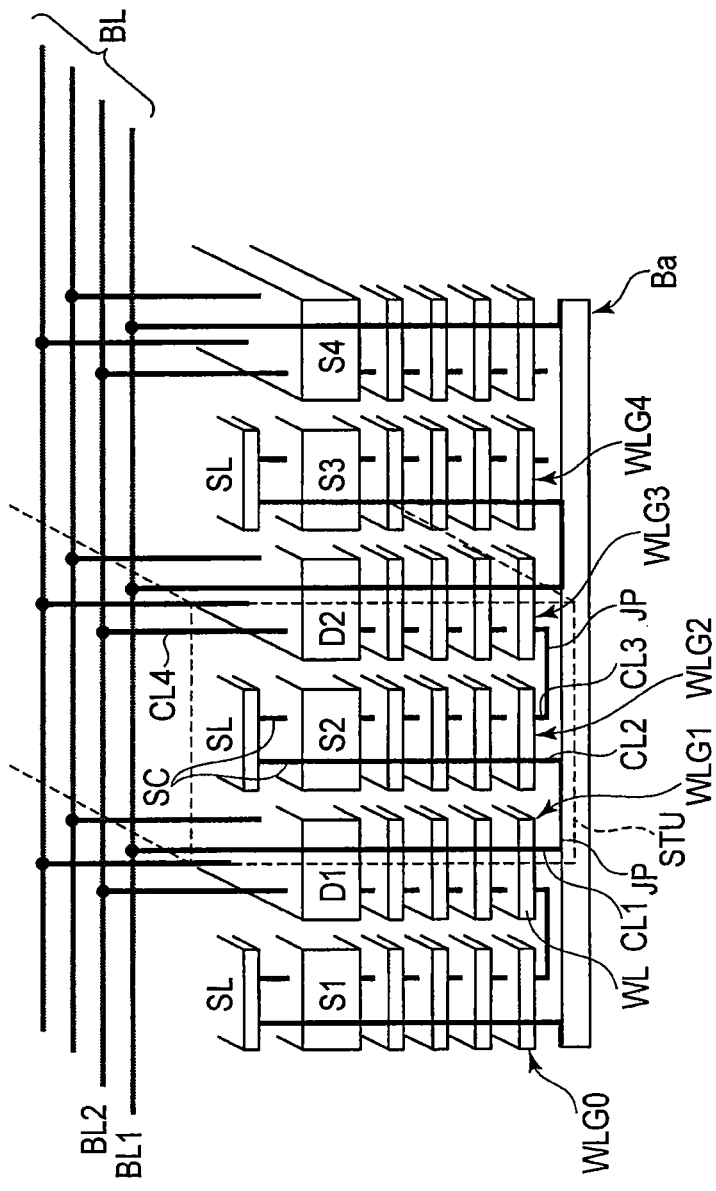
FIG. 22 is a circuit diagram showing a part of FIG. 22.
Figure 23:
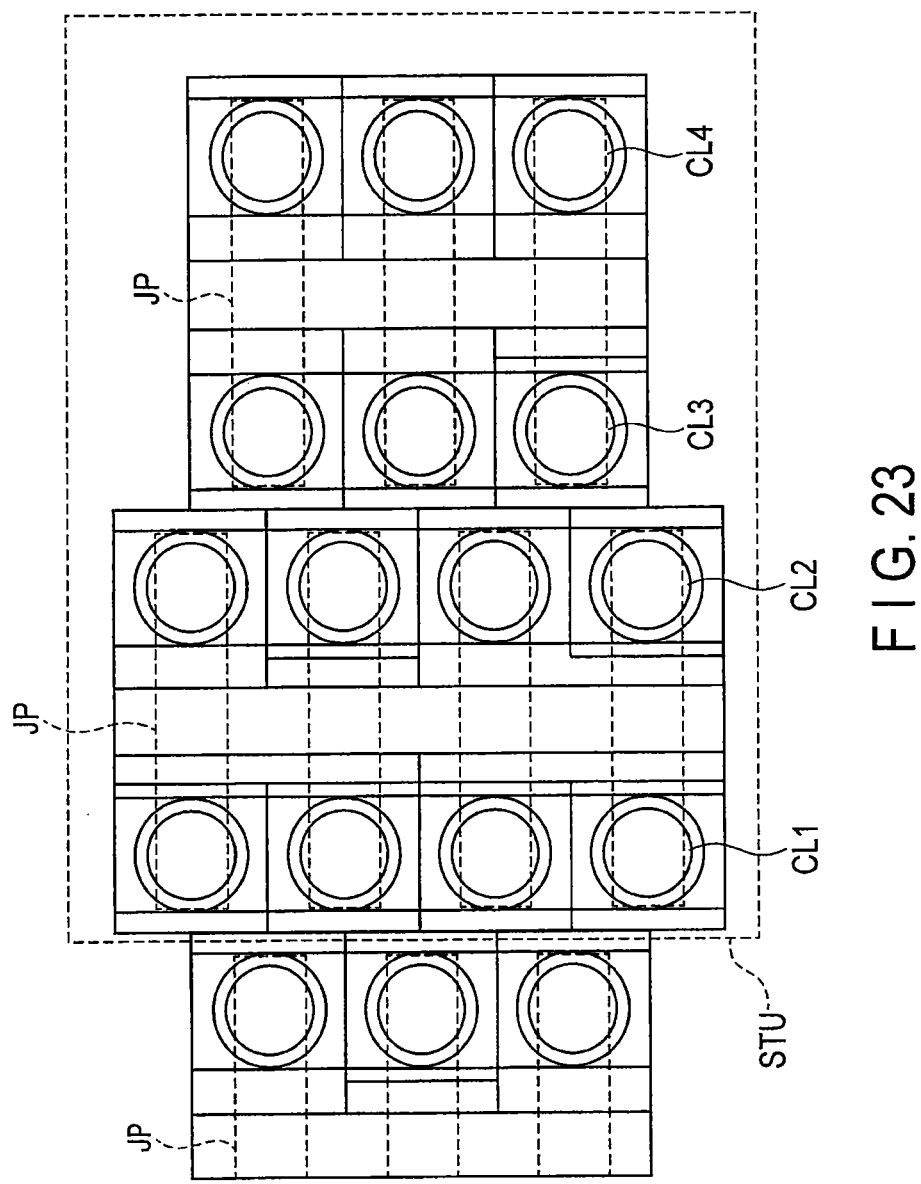
FIG. 23 is a plan view showing a part of FIG. 21 and FIG. 22.

FIG. 21, FIG. 22, and FIG. 23 show a configuration of a sixth embodiment. A configuration of a string unit of the sixth embodiment is different from that of the first to fifth embodiments In a BiCS flash memory, a columnar semiconductor that configures a channel is formed in an opening having a large aspect ratio. As the BiCS flash memory is further miniaturized, since it is required to reduce a pitch (distance) between openings, a configuration for disposing openings zigzag is examined.

FIG. 21 shows a plurality of blocks Bk−1, Bk, Bk+1 for configuring a memory cell array. The plurality of blocks Bk−1, Bk, Bk+1 are disposed along a plurality of bit lines BL. Each of the plurality of blocks Bk−1, Bk, Bk+1 has a plurality of string units STU disposed in a bit line direction. Each of the string unit STU includes, for example, three selection gate lines and three word line groups.

Further, a dummy region D is disposed between the respective blocks. Since each of the plurality of blocks Bk−1, Bk, Bk+1 has the same configuration, a configuration of the string unit STU will be explained using the block Bk.
(Configuration of String Unit STU)

As shown in FIG. 21 and FIG. 22, in the present embodiment, the string unit STU is configured by disposing a plurality of pieces of two NAND strings in a word line direction. The two NAND strings are configured by including first and third selection gate lines D1, D2 as a drain side selection gate line SGD, a second selection gate line S2 as a source side selection gate line SGS positioned between the first and third selection gate lines D1, D2, word line groups WLG1, WLG3 including a plurality of word lines WL disposed just below the first and third selection gate lines D1, D2, and a word line group WLG2 including the plurality of word lines WL disposed just below the second selection gate line S2. Word line group WLG1 in FIG. 21 is composed of four word lines located between the first selection gate line D1 and a coupling portion JP for example. The four word lines in the word line group WLG1 corresponds to the first semiconductors CL1.

Similarly, word line group WLG2 in FIG. 21 is composed of four word lines located between second selection gate line S2 and a coupling portion JP for example. The four word lines in the word line group WLG2 corresponds to the second semiconductors CL2. Word line group WLG3 in FIG. 21 is composed of four word lines located between the second selection gate line D2 and a coupling portion JP for example. The four word lines in the word line group WLG3 corresponds to the first semiconductors CL3.

That is, the first and third selection gate lines D1, D2, a second selection gate line S2, the word line groups WLG1, WLG3 arranged corresponding to the first and third selection gate lines D1, D2, and the word line group WLG2 arranged corresponding to the second selection gate line S2 are shared by two U-shaped semiconductors SC, respectively. The two U-shaped semiconductors SC are configured of first to fourth semiconductors CL1 to CL4 and a coupling portion JP.

Next, the configuration of the string unit STU will be specifically explained. The word line groups WLG1, WLG2, WLG3 are configured by stacking the plurality of word lines WL on a semiconductor substrate Ba, respectively. The first, second, and third word line groups WLG1, WLG2, WLG3 and the first, second, and third selection gate lines D1, S2, D2 are disposed in a direction orthogonal to the bit lines BL.

The first columnar semiconductor CL1 is caused to pass through the first selection gate line D1 and the word line group WLG1. An end of the first semiconductor CL1 is connected to a bit line BL1.

The second columnar semiconductor CL2 is caused to pass through the second selection gate line S2 and the word line group WLG2. As shown in FIG. 23, the second semiconductor CL2 is disposed at the same position as that of the first semiconductor CL1 in the word line direction. An end of the second semiconductor CL2 is connected to the source line SL. The other end of the second semiconductor CL2 is electrically connected to the other end of the first semiconductor CL1 via the coupling portion JP formed in the semiconductor substrate Ba.

The third columnar semiconductor CL3 is caused to pass through the second selection gate line S2 and the word line group WLG2. As shown in FIG. 23, the third semiconductor CL3 is disposed at a position offset in the word line direction with respect to the second semiconductor CL2. An end of the third semiconductor CL3 is connected to the source line SL.

The fourth columnar semiconductor CL4 is caused to pass through the third selection gate line D2 and the word line group WLG3. As shown in FIG. 23, the fourth semiconductor CL4 is disposed at the same position as that of the third semiconductor CL3 in the word line direction. An end of the fourth semiconductor CL4 is connected to a bit line B2. The other end of the fourth semiconductor CL4 is electrically connected to the other end of the third semiconductor CL3 via the coupling portion JP formed in the semiconductor substrate Ba.

Selection transistors are formed at the intersecting positions of the first and second, third, and fourth semiconductors CL1 to CL4 and the first, second, and third selection gate lines D1, S2, D2, and memory cells are formed at the intersecting positions of the first, second, third and fourth semiconductors CL1 to CL4 and the word line groups WLG1, WLG2, and WLG3.

The respective string units configure a logical block and are managed by a first logical block address. Note that it is also possible to define that a half string unit including one source line configures a half logical block and a half logical block shows a second logical block address.

(Access Prohibition Process)

In the above configuration, at the time of die sorting test, when a failure is detected in, for example, a word line of the word line group WLG1 corresponding to the first selection gate line D1, a threshold voltage of a first selection gate transistor including the first selection gate line D1 is written until the threshold voltage becomes equal to or more than a threshold voltage VH higher than a read voltage VSG of the first selection gate transistor.

Therefore, a first selection gate transistor connected to the first selection gate line D1 corresponding to the memory cell having the failure is set to a turned-off state at all times. Accordingly, it can be determined whether or not a failure is detected at the time of die sorting by, for example, applying a voltage VREAD to all the word lines of two half string units including the two NAND strings that share the first selection gate line D1 and executing reading, with a result that a control such as an access prohibition and the like can be executed.

That is, it can be determined that the word line group WLG1 selected by the first selection gate line D1 and two word line groups WLG0, WLG2 selected by the two selection gate lines S1, S2 located adjacent to the first selection gate line D1 are access prohibited regions.

In contrast, at the time of die sorting test, when a failure is detected in, for example, a word line of the word line group WLG2 corresponding to the second selection gate line S2, threshold voltages of the first selection gate transistor including the first selection gate line D1 and a third selection gate transistor including the third selection gate D2 which are positioned on both the sides of the second selection gate line S2 are set to the threshold voltage VH higher than the read voltage VSG of the first and third selection gate transistors.

Accordingly, it can be determined that an access to a string unit including four NAND strings that share the first and third selection gate lines D1, D2 is prohibited. That is, the first and third selection gate transistors connected to the first and third selection gate lines D1, D2 are set to the turned-off state at all times. Accordingly, the word line group WLG0, WLG1 and WLG2, WLG3, WLG4 selected by the first selection gate lines D1, D2 are the access prohibited regions.

(Management of Failed Logic Address)

As described above, the drain side selection gate SGD (D1, D3) of a string unit having a failure is set to the threshold voltage VH higher than the read voltage VSG of the selection gate. Accordingly, a failure can be determined by that a string unit having a failure is not turned off even if reading is executed by applying the read voltage VREAD to all the word lines of the string unit and the half string unit to which an attention is paid. A block address including the string unit whose failure has been detected is registered in, for example, a failed physical block information 1100 of a ROM fuse region 11a shown in FIG. 16 and FIG. 17.

Further, a first logical block address of a string unit address having a failure is registered to, for example, first failed logical block information 1300.

When, for example, the word line group WLG2 corresponding to the second selection gate line S2 includes a failure, an access to four half string units that share the first and third selection gate lines D1, D2 is prohibited. In the case, a first logical block address of three string units including the four half string units is registered to the ROM fuse region 11a as the first failed logical block information 1300.

Further, when, for example, the word line WLG1 corresponding to the first selection gate line D1 includes a failure, an access to two half string units that share the first selection gate line D1 is prohibited. In the case, a first logical block address of two string units including the two half string units is registered to the ROM fuse region 11a as the first failed logical block information 1300.

The first failed logical block information registered to the ROM fuse region 11a is read by power-on read and transferred to a memory controller 20. The memory controller 20 controls an access to a failed block based on the failed physical block information and the first logical block information. Accordingly, a failed block can be easily controlled without using a flag.

Further, when, for example, the word line group WLG2 corresponding to the second selection gate line S2 includes a failure at the time a failure which has been acquired is detected after shipment, a first logical address of three string units including the four NAND strings that share the first and third selection gate lines D1, D2 is registered to a management region 11b as the first failed logical block information 1300 shown in FIG. 19.

Further, when, for example, the word line WLG1 corresponding to the first selection gate line D1 includes a failure, a first logical block address of two string units including the two NAND strings that share the first selection gate line D1 is registered to the management region 11b as the first failed logical block information 1300 shown in FIG. 19.

Note that it is not necessary to manage a failure which has been acquired in the same manner as that of a failure that exits originally as described above, and when it is not necessary to manage the originally existing failure, a failure address can be also managed in a smaller unit, for example, in a word line unit.

According to the sixth embodiment, when an originally existing failure is detected in a semiconductor memory device having a string unit in which a drain side selection gate line and a source side the selection gate line are shared by two NAND strings, a threshold voltage of a selection gate transistor selected by a selection gate line corresponding to a word line group including a failure is set to a threshold voltage high than the read voltage and the selection gate transistor is set to the turned-off state at all times to thereby prohibit an access. Further, a string unit including the failure and a first logical block address of a string unit that shares the drain side selection gate line SGD (D1, D2) with the string unit is registered in the first failed logical block information 1300 of the ROM region 11a. Accordingly, the memory controller 20 can become aware of the string unit including the failure and the logical address of the string unit that shares the drain side selection gate line SGD (D1, D2) with the string unit by reading the contents of the ROM region 11a by power-on read. Accordingly, it is possible to certainly control a failed block and a failed string unit without using the flag.

Further, when a failure which has been acquired is detected after shipment, a failed logical address is registered to the first and second failed logical block information 1300, 1500 of the management region 11b. Accordingly, the memory controller 20 can certainly control the failed block and the failed string unit based on the first and second failed logical block information 1300, 1500 registered to the management region 11b.

Figure 26:
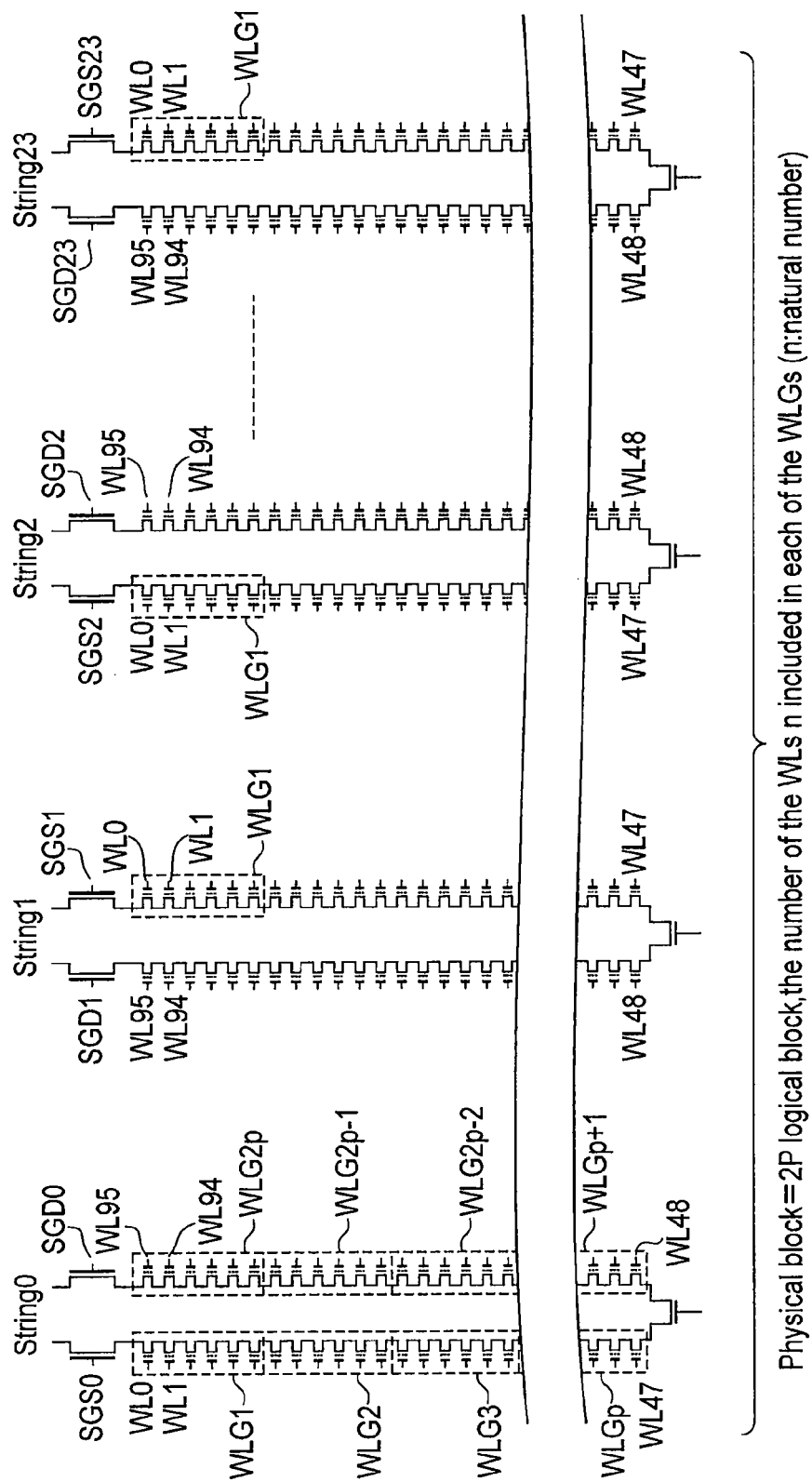
FIG. 26 is a view showing an example of a logical block applicable to respective embodiments.

In FIG. 26, for example, six adjacent memory cells of the plurality of memory cells being connected serially of the respective string units configure word line groups WLG1 to WLGp, WLGp+1 to WLG2p. The common word line groups WLG1 to WLGp, WLGp+1 to WLG2p of the respective string units configure logical blocks, respectively. Accordingly, in the example, 2p pieces of logical blocks exist. FIG. 26 typically shows a logical block configured by the word line group WLG1.

Figure 27:
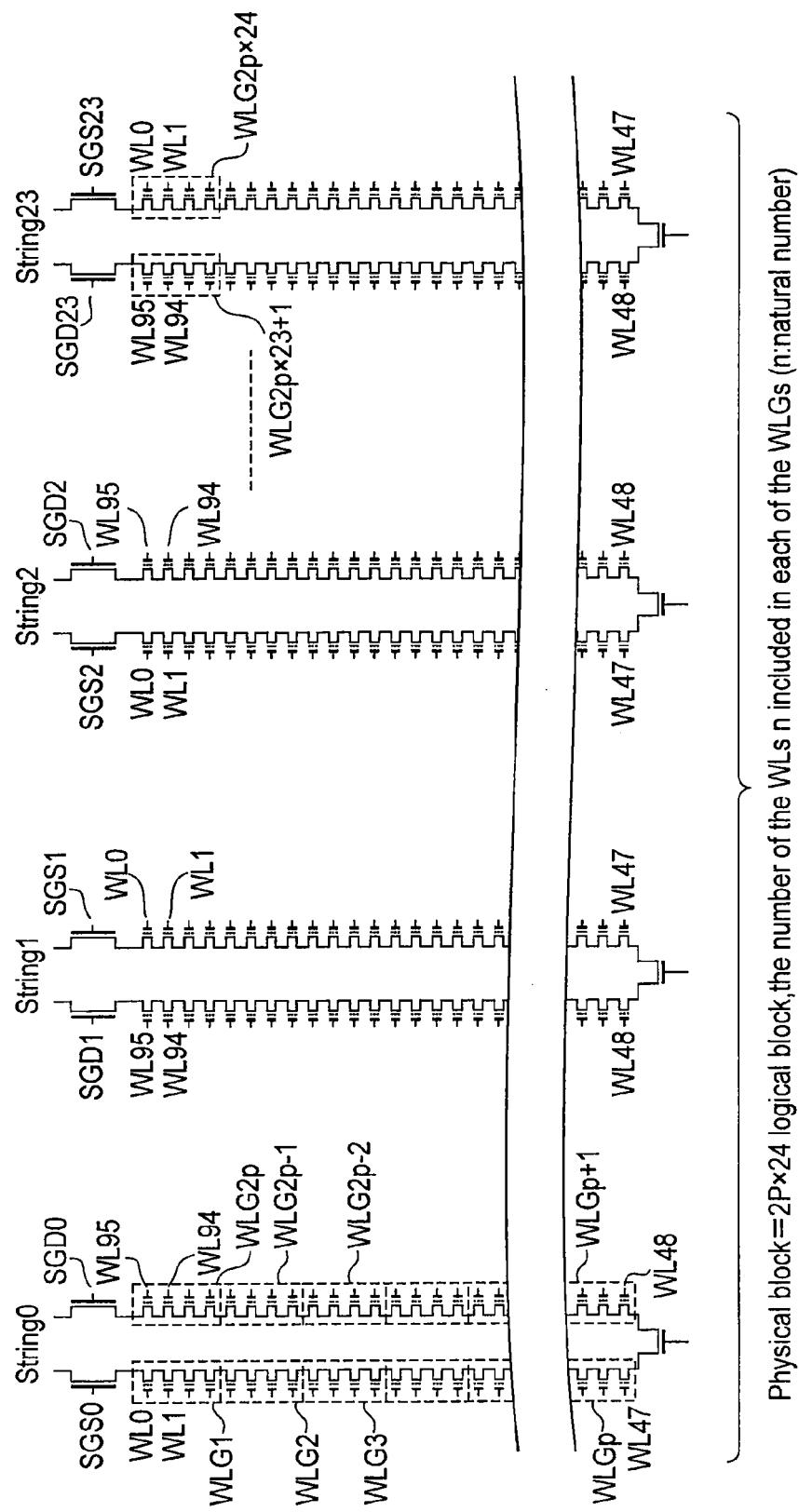
FIG. 27 is a view showing other example of the logical block applicable to the respective embodiments.

In FIG. 27, for example, six adjacent memory cells of the plurality of memory cells connected in series of the respective string units configure the word line groups WLG1 to WLGp, WLGp+1 to WLG2p. The word line groups WLG1 to WLGp, WLGp+1 to WLG2p of the respective string units configure logical blocks. Accordingly, in the example, 2p×2p pieces of logical blocks exist. FIG. 27 typically shows 2p pieces of logical blocks of string units String 0 and String 23.

Figure 28:
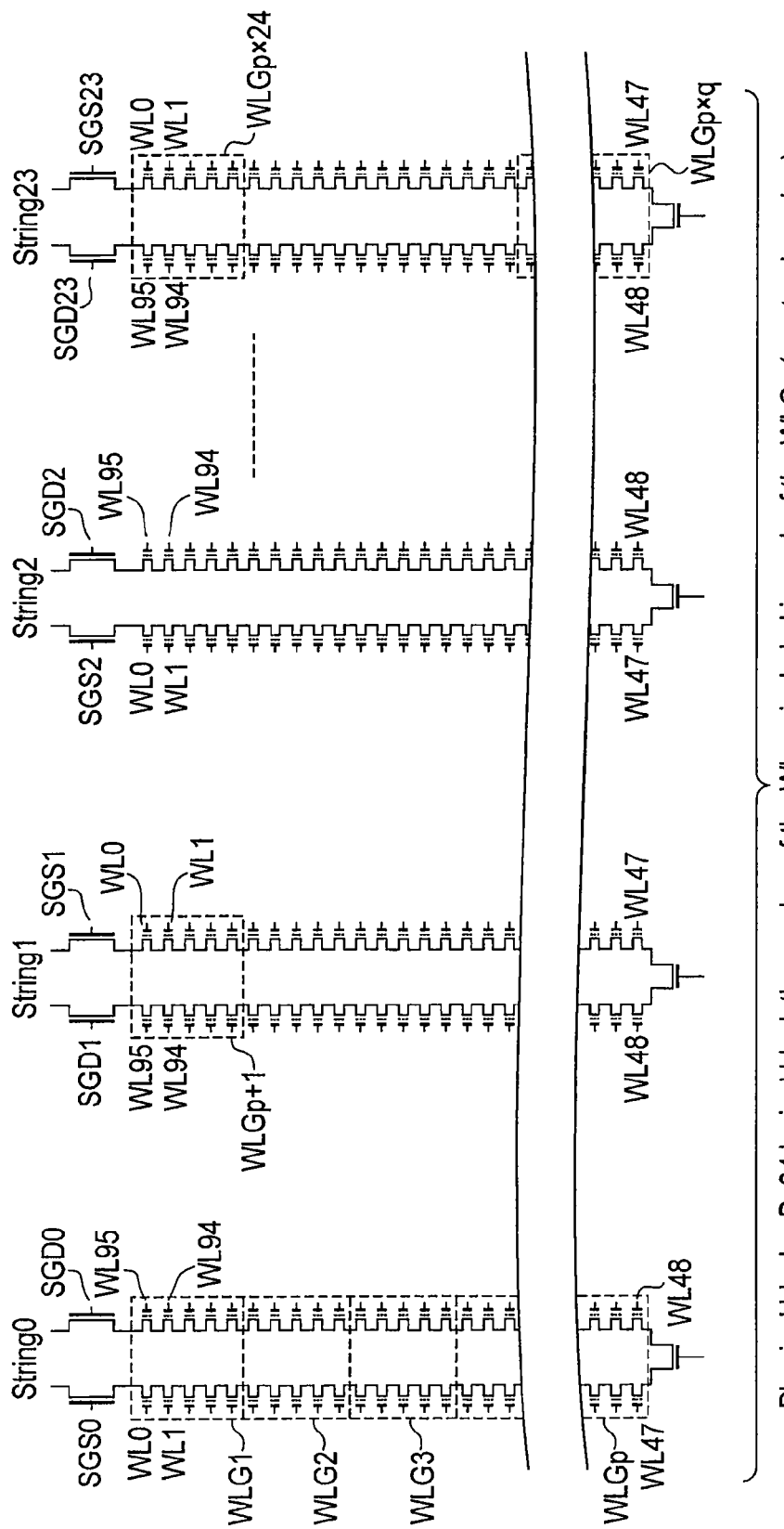
FIG. 28 is a view showing other example of the logical block applicable the respective embodiments.

In FIG. 28, for example, 10 memory cells from above the respective U-shaped string units configure the word line groups WLG1 to WLGp. That is, the respective word line groups WLG1 to WLGp comprises two sets of five memory cells connected in series, respectively. In the example, the respective word line groups WLG1 to WLGp configure logical blocks, respectively. Accordingly, in the example shown in FIG. 28, since 24 string units are included, p×24 pieces of logical blocks exist.

Figure 29:
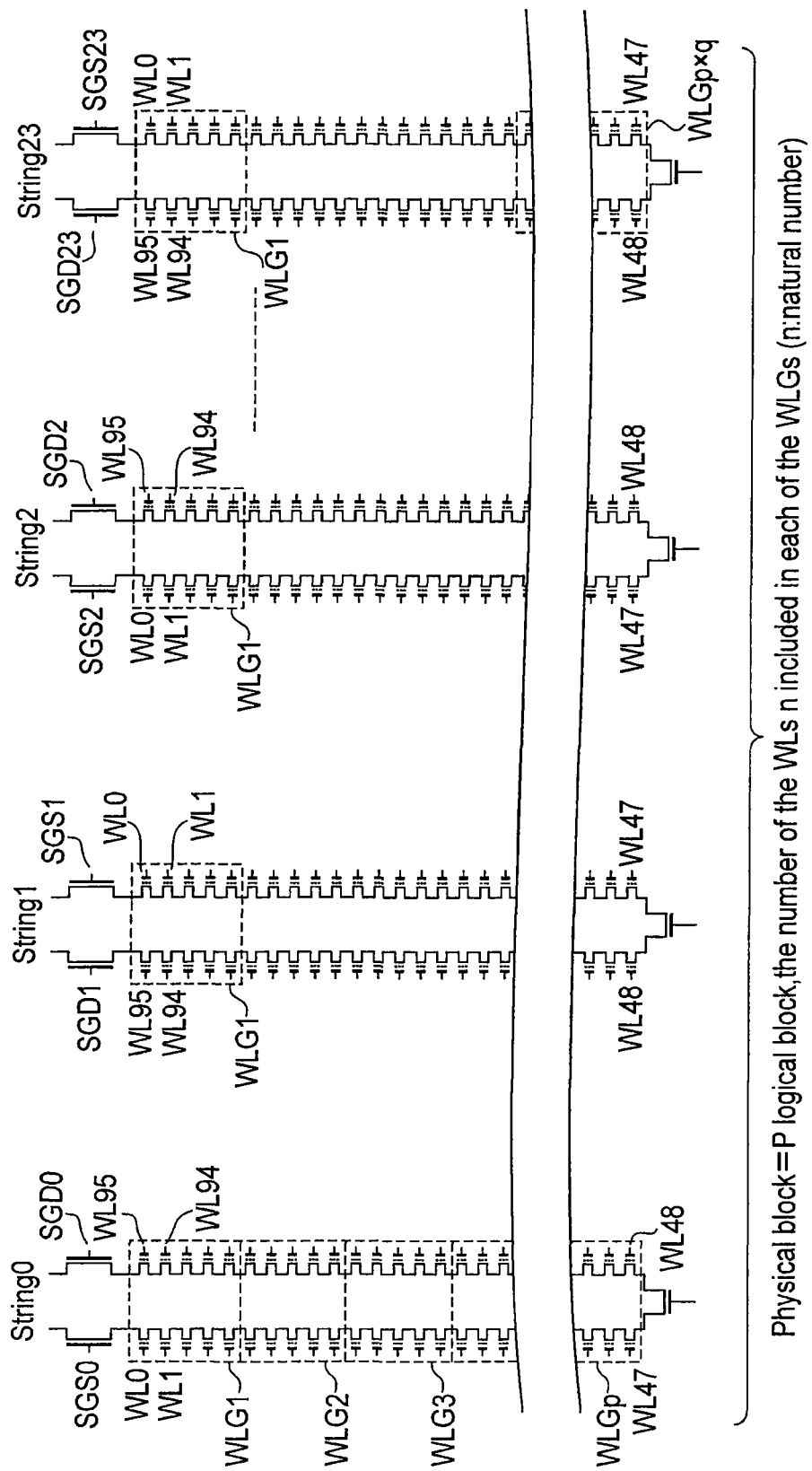
FIG. 29 is a view showing other example of the logical block applicable the respective embodiments.

In FIG. 29, for example, 10 memory cells from above the respective U-shaped string units configure the word line groups WLG1 to WLGp. That is, the respective word line groups WLG1 to WLGp comprises two sets of five memory cells connected in series, respectively. Further, in the example, the same word line groups of the respective string units configure logical blocks. Accordingly, in the example shown in FIG. 28, p×24 pieces of logical blocks exist. FIG. 28 typically shows a logical block configured of the word line group WLG1.

A memory cell array formation may be disclosed in U.S. patent application Ser. No. 12/407,403 filed on Mar. 19, 2009. U.S. patent application Ser. No. 12/407,403, the entire contents of which are incorporated by reference herein.

Furthermore, a memory cell array formation may be disclosed in U.S. patent application Ser. No. 12/406,524 filed on Mar. 18, 2009. U.S. patent application Ser. No. 12/406,524, the entire contents of which are incorporated by reference herein.

Furthermore, a memory cell array formation may be disclosed in U.S. patent application Ser. No. 12/679,991 filed on Mar. 25, 2010. U.S. patent application Ser. No. 12/679,991, the entire contents of which are incorporated by reference herein.

Furthermore, a memory cell array formation may be disclosed in U.S. patent application Ser. No. 12/532,030 filed on Mar. 23, 2009. U.S. patent application Ser. No. 12/532,030, the entire contents of which are incorporated by reference herein.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
    a memory cell array including a plurality of blocks, one of the blocks being a unit of an erase operation, the blocks including a first block, the first block including a plurality of memory cells stacked in a first direction crossing a semiconductor substrate, the first block including a plurality of pages, one of the pages being a unit of a read operation or a write operation, the pages including a first page and a second page; and
    a controller configured to execute a read operation for the first page when the controller receives an address corresponding to the first page, the controller being configured not to execute a read operation for the second page when the controller receives an address corresponding to the second page and the second page is defective.

2. The memory device according to claim 1,
    wherein the memory cell array is composed of a plurality of memory strings, one of the memory strings including a plurality of memory cells connected in series, a first select transistor, and a second select transistor, the memory cells being disposed between the first select transistor and the second select transistor.

3. The memory device according to claim 1, wherein a first data whether the first page is defective is stored in the memory cell array.

4. The memory device according to claim 3, wherein a second data whether the second page is defective is stored in the memory cell array.

5. The memory device according to claim 3, wherein the first data includes a plurality of block addresses and a plurality of logical block addresses.

6. A memory device comprising:
a memory cell array including a plurality of blocks, one of the blocks being a unit of an erase operation, the blocks including a first block, the first block including a plurality of word lines stacked in a first direction crossing a semiconductor substrate, the plurality of word lines including a first word line and a second word line, one of a plurality of memory cells being electrically connected to one of the word lines; and
a controller configured to execute a read operation for a memory cell electrically connected to the first word line when the controller receives address corresponding to the first word line, the controller being configured not to execute a read operation for a memory cell electrically connected to the second word line when the controller receives address corresponding to the second word line and the second word line is defective.

7. The memory device according to claim 6, wherein the memory cell array is composed of a plurality of memory strings, one of the memory strings including a plurality of memory cells connected in series, a first select transistor, and a second select transistor, the memory cells being disposed between the first select transistor and the second select transistor.

8. The memory device according to claim 6, wherein a first data whether the first word line is defective is stored in the memory cell array.

9. The memory device according to claim 8, wherein a second data whether the second word line is defective is stored in the memory cell array.

10. The memory device according to claim 8, wherein the first data includes a plurality of block addresses and a plurality of logical block addresses.

* * * * *